(12) United States Patent
Ishibashi et al.

(10) Patent No.: US 6,894,944 B2
(45) Date of Patent: May 17, 2005

(54) SEMICONDUCTOR INTEGRATED CIRCUIT DEVICE

(75) Inventors: Koichiro Ishibashi, Warabi (JP); Shoji Shukuri, Koganei (JP); Kazumasa Yanagisawa, Kokubunji (JP); Junichi Nishimoto, Hachiouji (JP); Masanao Yamaoka, Hachiouji (JP); Masakazu Aoki, Tokorozawa (JP)

(73) Assignee: Renesas Technology Corp., Tokyo (JP)

( * ) Notice: Subject to any disclaimer, the term of this patent is extended or adjusted under 35 U.S.C. 154(b) by 70 days.

(21) Appl. No.: 10/602,684

(22) Filed: Jun. 25, 2003

(65) Prior Publication Data

US 2004/0004879 A1 Jan. 8, 2004

Related U.S. Application Data

(63) Continuation of application No. 09/780,393, filed on Feb. 12, 2001, now Pat. No. 6,611,458.

(30) Foreign Application Priority Data

Feb. 10, 2000 (JP) ........................................ 2000-038167

(51) Int. Cl.[7] .............................................. G11C 8/00
(52) U.S. Cl. ........................... 365/230.06; 365/185.05; 365/189.12; 365/200
(58) Field of Search ....................... 365/230.06, 185.05, 365/63, 200; 355/189.12

(56) References Cited

U.S. PATENT DOCUMENTS

| | | | |
|---|---|---|---|
| 4,794,597 A | 12/1988 | Ooba et al. | |
| 5,089,433 A | 2/1992 | Anand et al. | |
| 5,163,023 A | 11/1992 | Ferris et al. | |
| 5,278,839 A | * 1/1994 | Matsumoto et al. | ........ 714/710 |
| 5,457,335 A | 10/1995 | Kuroda et al. | |
| 5,465,231 A | 11/1995 | Ohsaki | |
| 6,115,293 A | 9/2000 | Yamashita | |

FOREIGN PATENT DOCUMENTS

| | | |
|---|---|---|
| JP | 60201599 | 10/1985 |
| JP | 81123100 | 6/1988 |
| JP | 5114300 | 5/1993 |
| JP | 05298898 | 11/1993 |
| JP | 5314789 | 11/1993 |
| JP | 785692 | 3/1995 |
| JP | 7287994 | 10/1995 |
| JP | 10149694 | 6/1998 |
| JP | 1197652 | 1/1999 |

OTHER PUBLICATIONS

Takai et al., "A 250Mv/s/pin 1Gb Double Data Rate SDRAM with a Bi–Directional Delay and an Inter–Bank Shared Redundancy Scheme", 1999 IEEE Int'l Solid–State Circuits Conference, pp. 418–419.

* cited by examiner

Primary Examiner—Son T. Dinh
(74) Attorney, Agent, or Firm—Antonelli, Terry, Stout & Kraus, LLP

(57) ABSTRACT

To reduce cost of defect redundancy and trimming in a semiconductor integrated circuit having multiple layer wirings and copper wirings, an address for salvaging a defect of a memory cell array in a semiconductor is stored by using a nonvolatile memory element constituting a floating electrode by a first layer of polysilicon, or the nonvolatile memory element is programmed in testing the semiconductor integrated circuit. As a result, a special process is not needed in forming the nonvolatile memory element. In other words, the nonvolatile memory element can be formed in a process of forming a CMOS device and an apparatus of a laser beam for programming is not needed since the programming is carried out in testing. Thus, the time necessary for programming can be shortened, and, therefore, testing costs can be reduced.

5 Claims, 27 Drawing Sheets

FIG.12B

| | d01 | d02 | d03 | d04 | d05 | d06 | d07 | d08 | d09 | d110 | d111 | d112 | d113 | d114 | d115 | d116 | d117 | d118 | d119 | d120 | d121 | d122 | d123 | d124 | d125 | d126 | d127 | d128 | d129 | d230 | d231 | d232 | d233 | d234 | c00 | c01 | c02 | c03 | c04 | c05 | c06 |
|---|---|---|---|---|---|---|---|---|---|---|---|---|---|---|---|---|---|---|---|---|---|---|---|---|---|---|---|---|---|---|---|---|---|---|---|---|---|---|---|---|---|
| c/s0 | 1 | | | | 1 | 1 | 1 | 1 | | | 1 | | 1 | 1 | | | 1 | | | 1 | 1 | | | 1 | | | 1 | 1 | | | | | 1 | 1 | 1 | | | | | | |
| c/s1 | 1 | 1 | 1 | | | 1 | 1 | 1 | | | 1 | 1 | | 1 | 1 | | | 1 | | 1 | 1 | | 1 | 1 | 1 | 1 | | | 1 | | 1 | | 1 | | | 1 | | | | | |
| c/s2 | 1 | 1 | 1 | | | | | 1 | 1 | 1 | | | 1 | | 1 | 1 | 1 | | 1 | | | 1 | 1 | | 1 | | | 1 | | 1 | | 1 | 1 | 1 | | | 1 | | | | |
| c/s3 | 1 | 1 | | | | | | | 1 | 1 | | | | 1 | | | 1 | 1 | 1 | | | 1 | 1 | 1 | 1 | | | | 1 | 1 | | | | | | | | 1 | | | |
| c/s4 | | 1 | 1 | 1 | | | | | | 1 | 1 | 1 | | 1 | | | | 1 | 1 | | 1 | | | 1 | 1 | 1 | 1 | 1 | 1 | 1 | 1 | 1 | | 1 | | | | | 1 | | |
| c/s5 | | | 1 | 1 | 1 | 1 | | | | 1 | 1 | | 1 | | 1 | 1 | | 1 | 1 | 1 | | | | | | 1 | 1 | | | | | | | | | | | | | 1 | |
| c/s6 | | | | 1 | 1 | 1 | 1 | | | 1 | | 1 | 1 | | 1 | | | 1 | 1 | 1 | 1 | 1 | 1 | | | | 1 | 1 | 1 | 1 | 1 | | 1 | 1 | | | | | | | 1 |

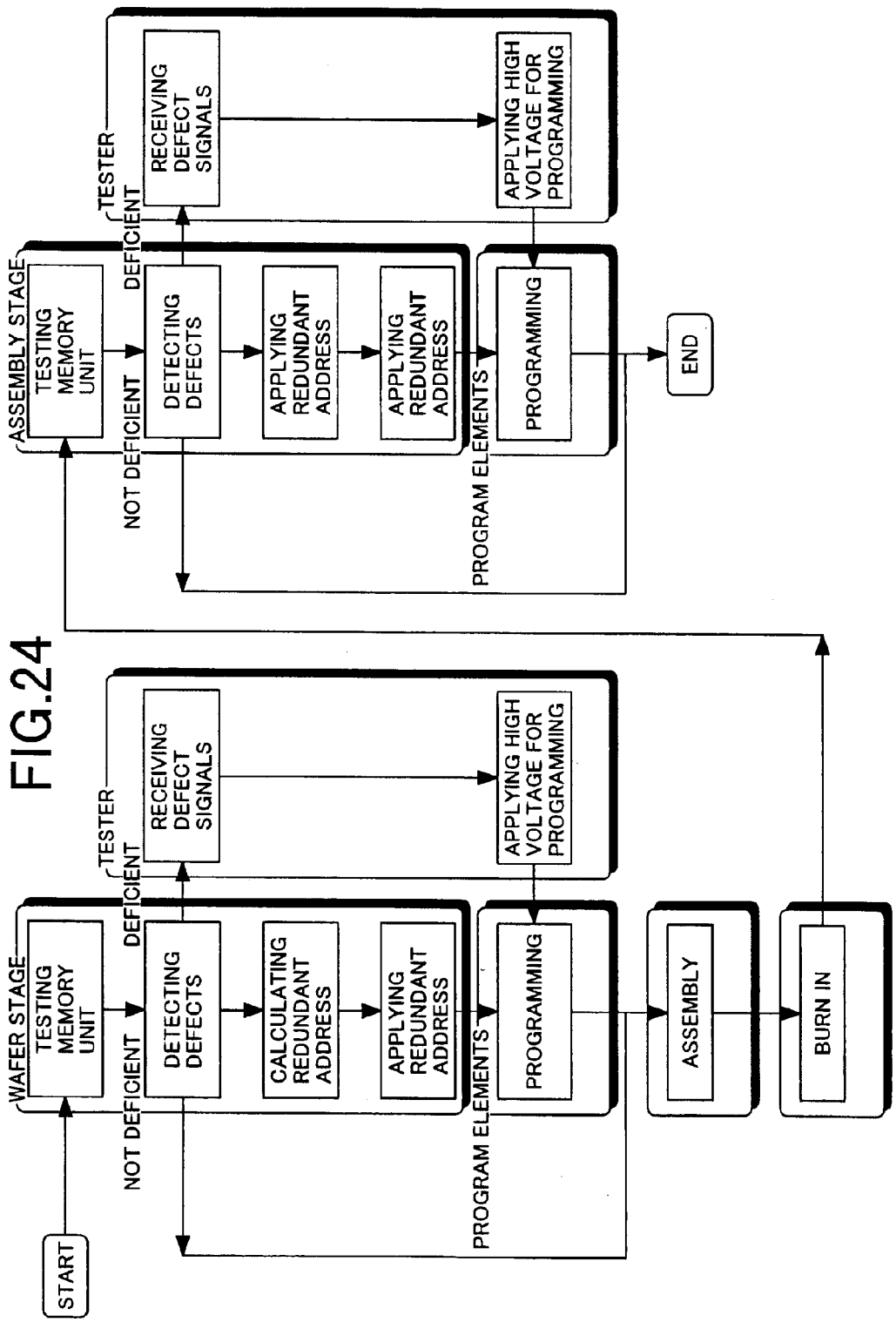

SEMICONDUCTOR INTEGRATED CIRCUIT DEVICE

CROSS-REFERENCE TO RELATED APPLICATIONS

This application is a Continuation application, of U.S. patent application Ser. No. 09/780,393, filed Feb. 12, 2001 now U.S. Pat. No. 6,611,458, the entire disclosure of which is hereby incorporated by reference.

FIELD OF THE INVENTION

The present invention relates to a semiconductor integrated circuit device, particularly to a semiconductor integrated circuit device preferable for carrying out defect redundancy of a memory cell array without increasing fabrication cost in a highly-integrated semiconductor integrated circuit using multiple layer wirings.

BACKGROUND OF THE INVENTION

Conventionally, in defect redundancy in multiple layer wirings, as a system of programming a location where the defect is disposed, there has been used a method of cutting polysilicon by laser beam or a method of cutting wirings by laser beam. The method is as described in an example executed in DRAM of IEEE International Solid-State Circuits Conference, Digest of Technical Papers, p.p. 418–419.

When introducing defect redundancy to a semiconductor integrated circuit, in order to reduce cost, the following elements must be considered.

(1) Preventing fabrication steps from increasing.
(2) Reducing chip area.
(3) Reducing testing and redundancy steps.

In view of the above-described elements, the above-described defect redundancy system of the conventional technologies poses the following problem.

(1) According to the cutting method by laser beams, first, after finishing a semiconductor integrated circuit at a wafer stage, inspection is carried out by using a probe, thereafter, cutting is carried out by using a cutting apparatus by laser beam. In the case of such the cutting system, other than newly requiring the laser cutting apparatus, time is taken in a series of steps from inspection by probe to cutting by laser beam. Therefore, testing steps including a redundancy step are complicated, resulting in an increase in cost.

(2) In order to melt and cut polysilicon by laser beam, it is necessary to previously remove an insulating film on polysilicon. However, according to a semiconductor integrated circuit using multiple layer wirings, an insulating film on polysilicon is thickened and the thicker the insulating film the more difficult removal thereof. Particularly, when wiring is carried out by copper, an insulating film is constituted by a structure of alternately laminating silicon nitride films and silicon oxide films and it is extremely difficult to remove the insulating film on polysilicon in such a structure. Further, although the copper wirings per se can be cut by laser beam as in the conventional example, the melting point of copper is higher than that of aluminum and laser beam for cutting needs larger energy. A structure at a surrounding of a portion to be cut may be damaged by the large energy of laser beam.

It is a problem to be resolved by the invention to provide a defect redundancy circuit resolving the problem of the defect redundancy circuit in multiple layer wirings and preventing fabrication cost, chip area and testing cost from increasing even in an integrated circuit using a multiple layer wiring process or copper wirings.

SUMMARY OF THE INVENTION

In order to achieve a solution of the above-described problem, according to an aspect of the present invention, there is provided a semiconductor integrated circuit device comprising a memory cell array including memory cells, redundant memory cells for substituting for deficient memory cells when there are the deficient memory cells having defects in the memory cell array, a nonvolatile memory for storing redundant address information based on the deficient memory cells, and a redundant decoder for controlling to switch a connection between an output from the memory cell array and an output from the redundant memory cells by the redundant address information stored to the nonvolatile memory, wherein the nonvolatile memory includes a first conductive type of a first semiconductor area and a second conductive type of a second semiconductor area provided along a main face of a semiconductor substrate and a floating gate arranged to interpose an insulating film between the first and the second semiconductor areas and the floating gate and data can be erased or written by applying predetermined voltage to a source area and a drain area of the second conductive type arranged at the first semiconductor area and the second semiconductor area.

Further, redundant data is written to the nonvolatile memory in testing the semiconductor integrated circuit mounted therewith.

BRIEF DESCRIPTION OF THE DRAWINGS

FIG. 12B is a table showing correspondence between data and parity bits and FIG. 12C is a diagram showing an error correcting circuit based on the correspondence shown in FIG. 12B;

FIG. 24 is a diagram showing a redundancy method of the embodiment of FIG. 23.

DETAILED DESCRIPTION OF THE PREFERRED EMBODIMENT

The significance of the present invention will become apparent by embodiments of the present invention as follows.

Figure 1B:
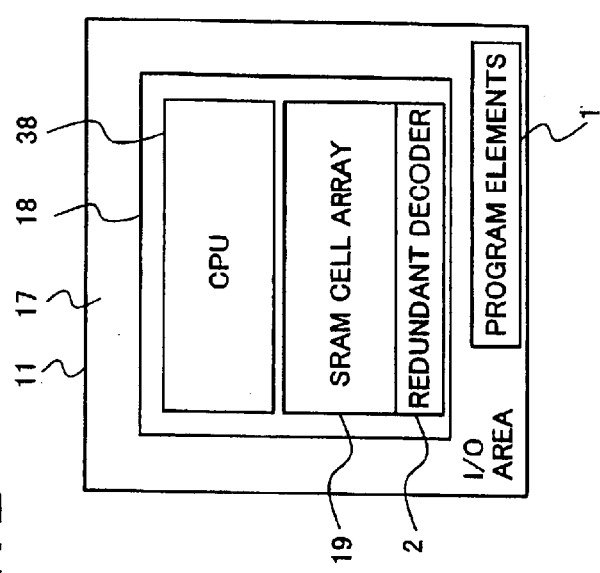
FIG. 1B is a block diagram of a chip having the defect redundancy circuit.
Figure 1D:
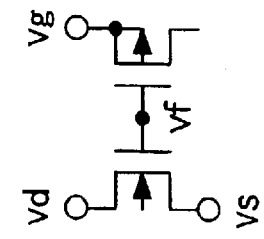
FIG. 1C is a sectional view of a chip and FIG. 1D is a circuit diagram of a flash memory.
Figure 1A:
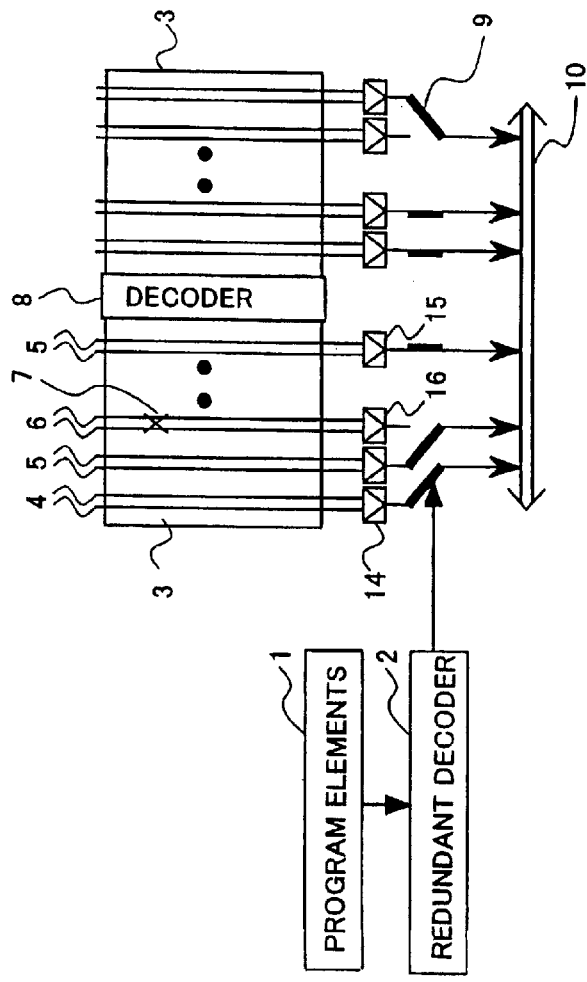
FIG. 1A is a schematic view of a memory cell array of SRAM having a defect redundancy circuit according to an embodiment of the present invention.
Figure 1C:
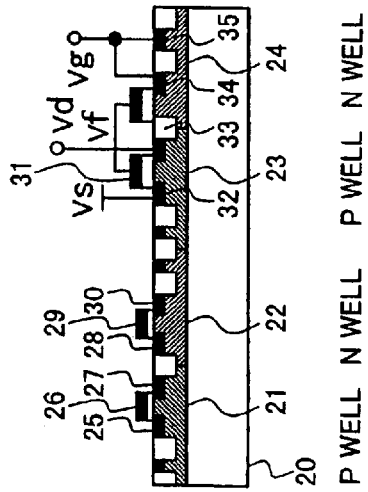

FIGS. 1A, 1B, 1C and 1D are diagrams showing a first embodiment. FIG. 1A is a schematic diagram of a memory cell array of SRAM having a defect redundancy circuit, FIG. 1B is a block diagram of a chip having the redundancy circuit, FIG. 1C is a sectional view of the chip and FIG. 1D is a circuit diagram of a flash memory.

In FIG. 1A, numeral 1 designates program elements by flash memories, 2 designates a redundant decoder, 3 designates a memory cell array, 4 designates a redundant bit line, 5 designates a bit line, 6 designates a bit line connected with a memory cell 7 having defect, 8 designates a decoder, 9 designates a switch, 10 designates a buss, 14 designates a sense amplifier for redundancy and numerals 15 and 16 designate sense amplifiers.

The memory cell array of SRAM is provided with a defect at the memory cell 7 connected to the bit line 6 and the position of the defect is programmed to program elements 1. By reconnecting connection of the switch 9 via the redundancy decoder 2, data can be read without using a result of amplifying a signal from the bit line 6 connected to the memory cell having the defect.

FIG. 1B shows an example of laying out respective circuits on a chip. Numeral 11 designates a chip, 17 designates an I/O circuit portion (I/O portion) and 18 designates a core portion. The core portion 18 includes CPU 38 and an SRAM cell array 19. It is preferable to place the program elements 1 in the I/O portion. In this case, redundancy can be executed without increasing an area of the core portion.

FIG. 1C is a sectional view of the core portion 18 and the program elements 1. Numeral 20 designates a P-type silicon substrate, numerals 21 and 23 designate P-wells and numerals 22 and 24 designate N-wells. Numerals 25, 26 and 27 (28, 29, 30) designate a source, a gate and a drain of an NMOS (PMOS) transistor of the core portion 18. By using the NMOS transistor and the PMOS transistor, there can be constituted SRAM of 6 MOS type comprising two load MOS transistors, two drive MOS transistors and two transfer MOS transistors.

Further, numerals 32 and 33 designate $n^+$ regions, 34 designates $p^+$ region, 35 designates $n^+$ region and 31 designates a floating gate electrode. Thereby, there is constituted a flash memory as shown by FIG. 1D. In FIG. 1D, notation Vd designates a drain, notation Vs designates a source, notation Vg designates a control gate electrode and notation Vf designates the floating gate electrode. According to the flash memory cell, at an initial state, that is, at the stage of finishing fabrication steps, electrons are not present at the floating gate electrode Vf and threshold voltage is provided with a comparatively low value. In contrast thereto, the threshold can be made high by injecting electrons to the floating gate electrode Vf. By taking out a difference of the thresholds as a signal, a nonvolatile storage element can be formed. According to the present invention, by utilizing such a flash memory as a program element, a redundancy circuit shown by FIG. 1A is constituted. Further, in FIG. 1C, numeral 32 corresponds to the source electrode Vs, 33 corresponds to the drain electrode Vd and numerals 34, 35 and 24 correspond to the control gates Vg.

A description will be given of an example of a voltage relationship for erasing, writing and reading the flash memory. In the erasing operation, the control gate electrode Vg is applied with the ground potential of 0V, the source Vs is applied with 7V and the drain Vd is applied with the ground potential of 0V. In this case, electrons are drawn from the floating gate electrode Vf to the source Vs and the threshold voltage of the flash memory is lowered. In the writing operation, the control gate electrode Vg is applied with 5V, the source Vs is applied with 5V and the drain Vd is applied with the ground potential of 0V. In this case, hot electrons are injected to the floating gate electrode Vg and the threshold voltage of the flash memory is elevated. In the reading operation, the control gate electrode Vg is applied with voltage to a degree of not generating hot electrons, for example, 1.8V and the source Vs is applied with the ground potential of 0V. A further detailed description will be given later of the writing and reading operation including the circuit constitution.

According to a so-called stack type flash memory, a floating gate and a control gate are fabricated by polysilicon layers different from each other. In this case, fabrication cost thereof is increased since steps of fabricating polysilicon is increased. In contrast thereto, according to the embodiment, a flash memory can be fabricated by a single layer of polysilicon and therefore, the flash memory can be fabricated without changing a normal process of fabricating CMOS.

Further, the flash memory cell of FIG. 1D is constructed by a structure of combining substantially two transistors and accordingly, an area thereof is increased more than a stack type flash memory. However, when the flash memory cell is used for defect redundancy of a memory cell as in the embodiment, the number of bits necessary for programming is small, the program elements can be incorporated in input/output circuit area and the area is not increased substantially.

For example, when the number of the sense amplifiers 14 in the defect redundancy circuit shown by FIG. 1A is set to 64 pieces, the redundancy can be executed only by 6 bits of the program elements. Although in 0.25 micrometer process, the area of the memory cell of FIG. 1D is about 10 square micrometers, the flash cell of 6 bits is 60 square micrometers. Even when an area of a total of an integrated circuit is 5 millimeters square, the rate of the area relative to the total area is only 0.00024% and the increase of the area of the flash memory cell poses no problem.

As has been described, according to the embodiment, without introducing a special process as in fabricating a floating gate, the flash memory can be constituted and by using such a flash memory as a nonvolatile program element storing defect information, the defect redundancy circuit can be introduced without increasing the area.

Figure 2A:
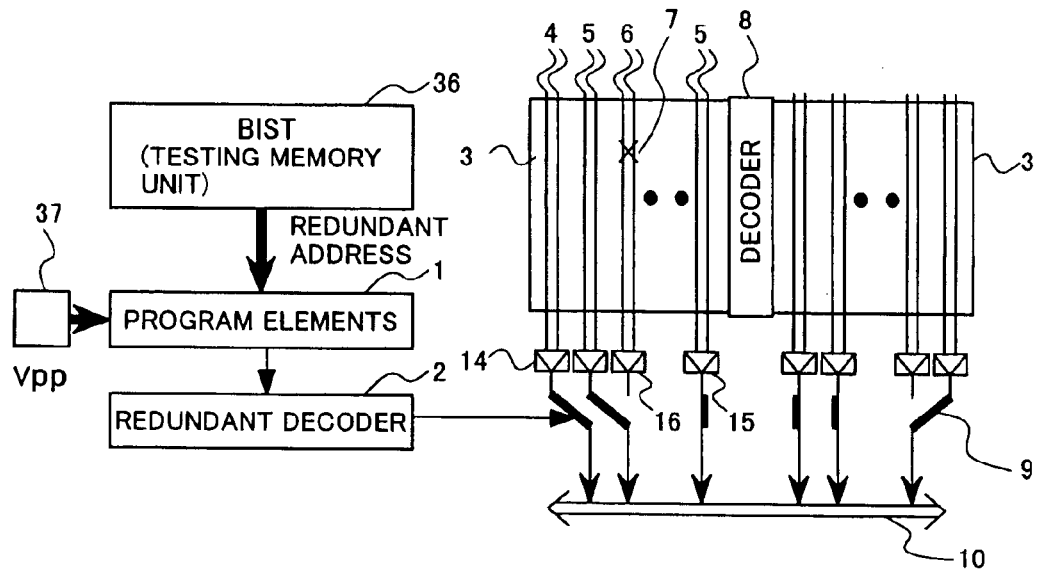
FIG. 2A is a block diagram according to a second embodiment of the present invention and FIG. 2B is a flow diagram of testing.
Figure 2B:
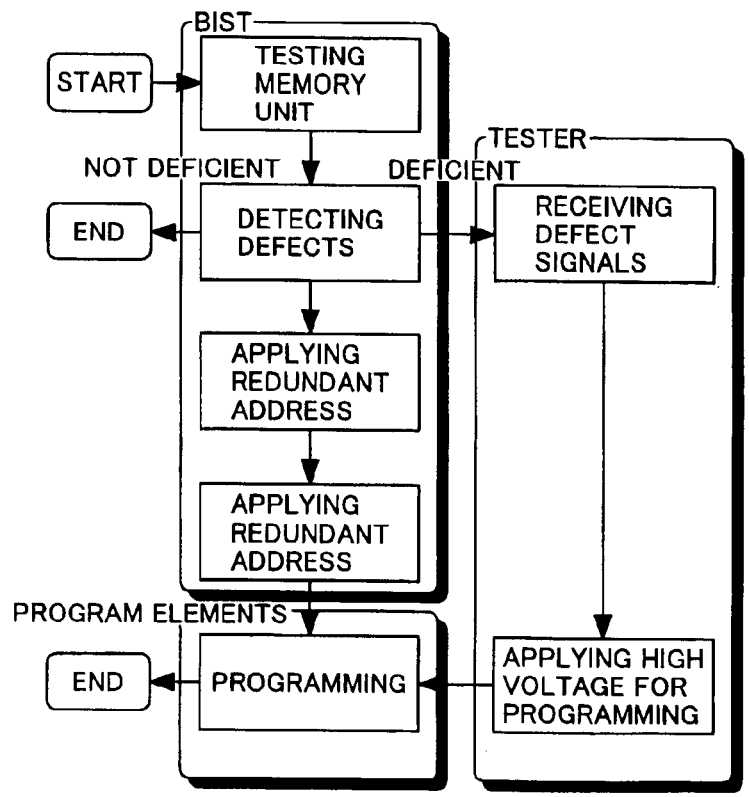

FIG. 2A is a block diagram according to a second embodiment of the invention and FIG. 2B is a flowchart of testing.

In addition to the constitution of FIG. 1A, there are provided a BIST (Built in Self-Test) circuit block 36 constituting a logic circuit portion having a function of inspecting a cash memory array and Vpp pin 37 constituting a pin for applying high voltage necessary for programming data to a program element.

The BIST circuit 36 automatically forms a test pattern of a cash memory array to apply to the cash memory cell array and executes inspection of the memory array in a short period of time. Particularly, according to the BIST circuit 36 of the embodiment, there is provided a function of automatically forming redundant address from a result of inspecting the memory cell array.

According to the embodiment, redundancy is carried out by a testing flow shown by FIG. 2B. After the testing is started, first, it is inspected by the BIST circuit 36 whether the cash memory array 3 is deficient. When the cash memory array 3 is not deficient, the testing with regard to the memory ends. When the memory is deficient, information of being deficient is transmitted to a tester. Meanwhile, BIST circuit 36 calculates redundant address and transmits the calculated address to the program elements 1. Thereafter, high voltage for programming is applied from the tester to the flash memory via the Vpp pin 37. At this occasion, data in correspondence with the redundant address is programmed to the flash memory and the operation ends.

According to the embodiment, all of the series of operation can be carried out electrically. Therefore, the defect redundancy can be carried out in the midst of inspection which is carried out after finishing the wafer. Therefore, according to the embodiment, increase of inspection time period or apparatus necessary for testing or defect redundancy can be minimized, as a result, there is achieved an effect capable of reducing testing cost.

Figure 10A:
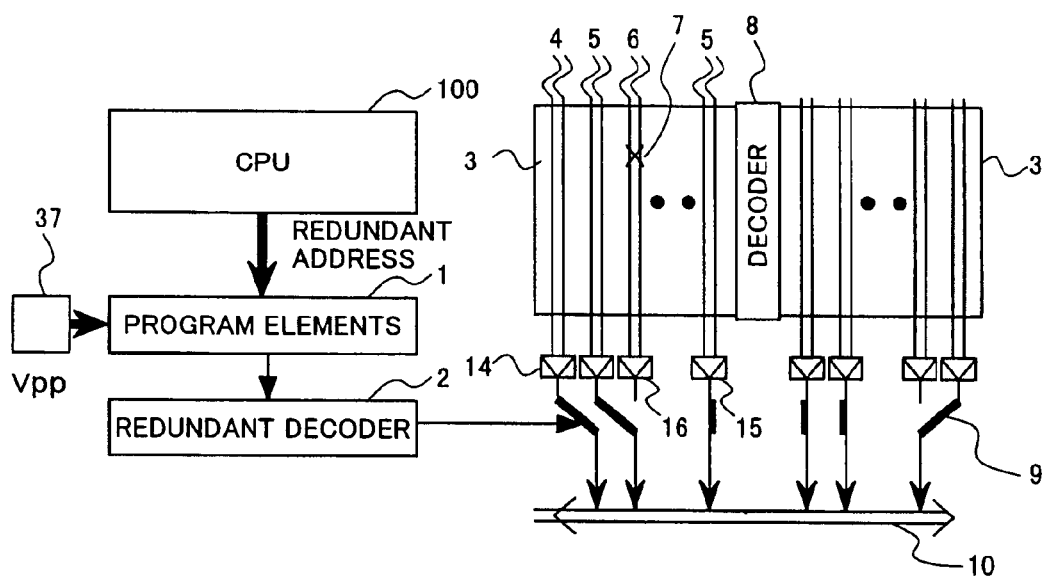
FIG. 10A is a block diagram showing a modified example of the second embodiment according to the present invention and FIG. 10B is a flow diagram of testing.

Further, whereas the memory is inspected by a circuit block exclusive for inspection of the memory as described above, as shown by FIG. 10, in an integrated circuit device having CPU, the memory may be inspected by a function provided to CPU. CPU referred to here indicates a portion comprising a calculator circuit block for calculating operation and a circuit block for controlling thereof. A microprocessor is normally mounted simultaneously with such CPU and cash memory.

Figure 10B:
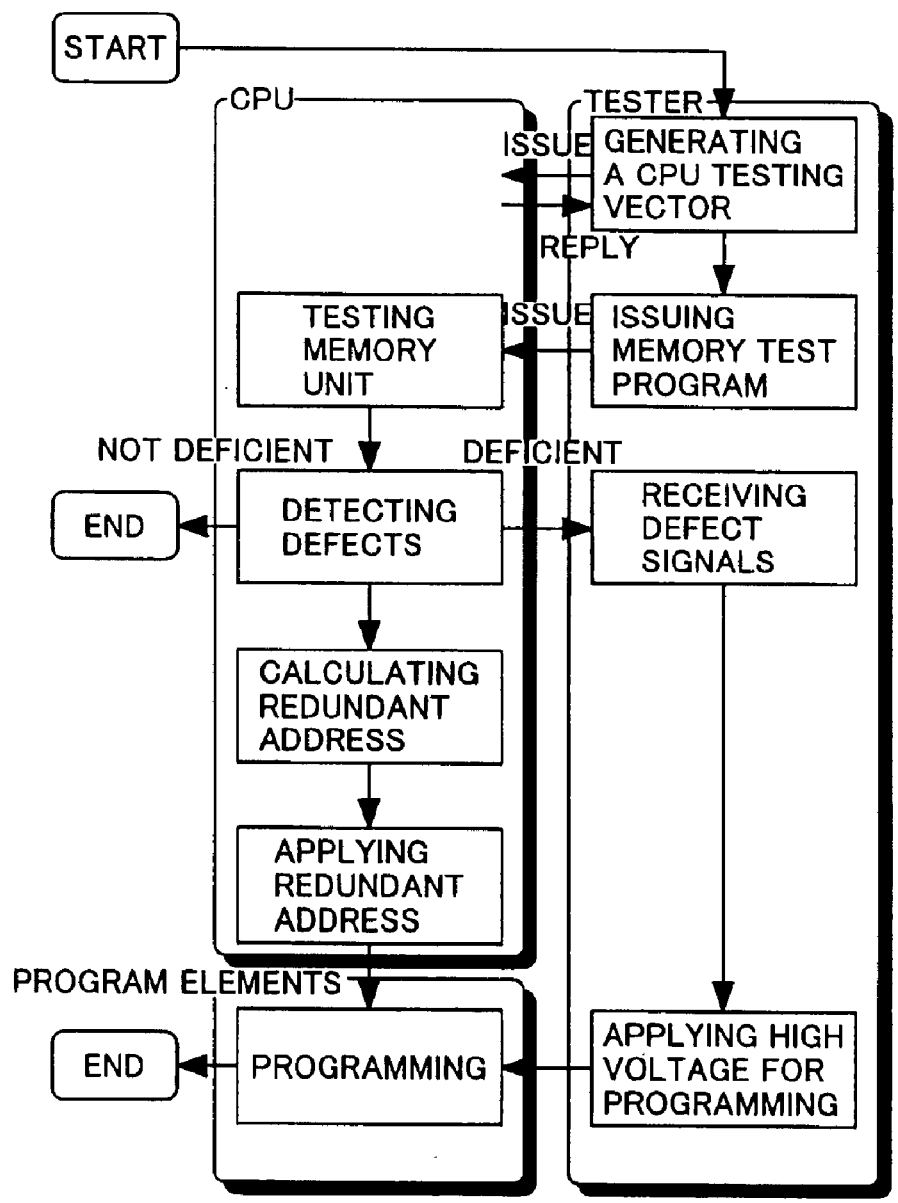

The testing process of the embodiment is shown by FIG. 10B. First, the tester forms a test vector for inspecting CPU 100 and applies the vector to the semiconductor integrated circuit. CPU 100 answers the applied test vector. When the answer of the tester is not correct, the function of CPU is regarded as incorrect and the semiconductor integrated circuit is determined to be failed. Meanwhile, when the answer is correct, the function of CPU is determined to be normal and a program for inspecting memory is transmitted to CPU 100. CPU 100 inspects the memory by itself by using the program and reports the result to the tester and simultaneously forms a redundant address to transmit to the program elements. The procedure is the same as that in the embodiment of FIG. 2.

According to the embodiment, even when there is not a hardware for inspecting the memory, the redundancy can be executed and therefore, the redundancy of the memory can be executed by a minimum area by preventing an increase in the area necessary for the hardware for memory inspection.

Figure 3B:
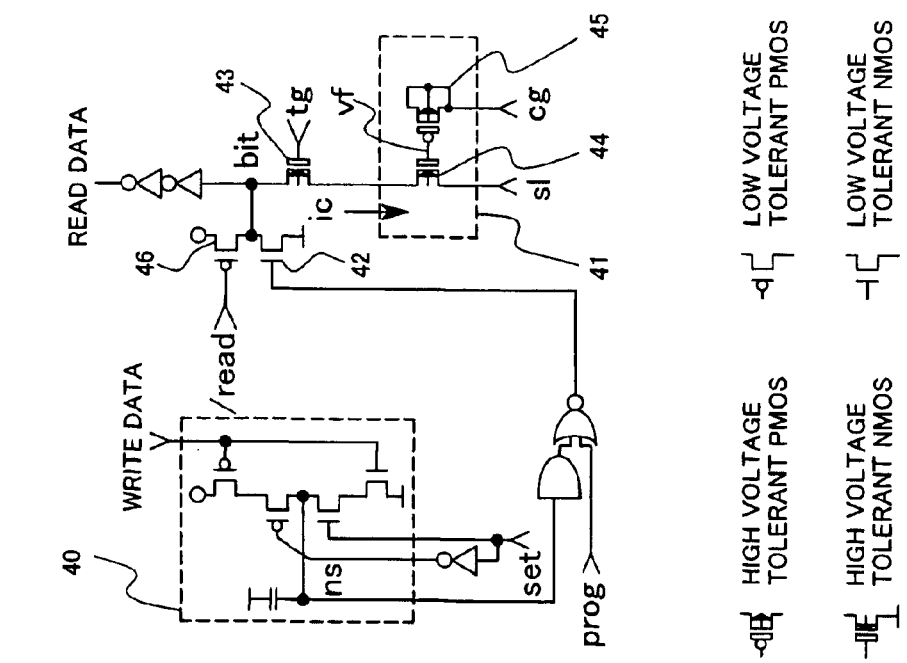
FIG. 3A is a circuit diagram of a flash memory of the present invention and FIG. 3B is an operational waveform diagram in writing and in reading.
Figure 3A:
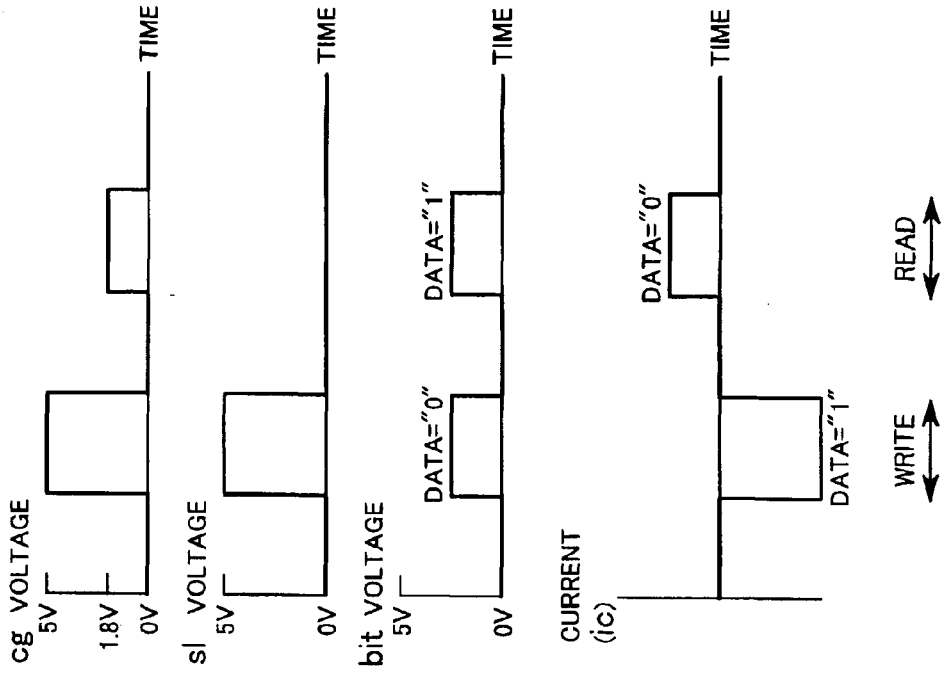

FIG. 3A is a circuit diagram of a portion of a flash memory according to the present invention and FIG. 3B is an operational waveform diagram in writing and reading.

In FIG. 3A, numeral 40 designates a register for accumulating data for writing and numeral 41 designates a flash memory cell. An explanation will be given of operation for the flash memory of the invention in reference to the drawings.

First, a set signal is made "H" and data to be written to the flash memory is set to a node ns in the register 40. The date to be written is, for example, the redundant address shown in FIG. 2B.

When data is written to the flash memory, first, a prog signal for permitting the program is made "L" and a data signal is transmitted to a MOS transistor 42. When the data is "1", the MOS transistor 42 is brought into an ON state. Meanwhile, a transistor 44 of the flash memory is brought into an ON state when the source is applied with a source line signal sl and a control gate cg constituting the gate of the flash memory cell is applied with voltage necessary for programming the flash memory, for example, 5V. Further, voltage is applied also to a through gate tg of a MOS transistor 43 to thereby bring the transistor into an ON state. At this occasion, current flows by a path from the signal line sl to the MOS transistors 44, 43 and 42. At this time, by current flowing in a state of high drain voltage, hot electrons are generated at the channel of the MOS transistor 44 and electrons are injected to a floating gate Vf by exceeding a barrier of an oxide film. Thereby, threshold voltage of the MOS transistor 44 is elevated and "1" is written. When write data is "0", the MOS transistor 42 is brought into an OFF state and at that occasion, current does not flow to the MOS transistor 44 and the threshold voltage remains unchanged. The injected electrons are accumulated in the floating electrode and accordingly, there is maintained a state in which electricity is not discharged even when power source is cut.

Meanwhile, in reading operation, the control gate cg is applied with voltage of "H" by which electrons are not generated, for example, 1.8V. When electrons have been injected to the floating gate Vf, the threshold voltage of the MOS transistor 44 is elevated and therefore, the MOS transistor 42 is not made ON. When electrons have not been injected, the threshold stays to be low and accordingly, the MOS transistor 42 is made ON. In reading operation, a PMOS transistor 46 is brought into an ON state by a /read signal. Further, the through gate tg is applied with predetermined voltage to thereby make the MOS transistor 43 ON. At that time, when data is "1", current does not flow and bit terminal voltage is elevated and "H" is outputted.

Further, when data is "0", current flows, the bit terminal voltage is lowered and "L" is outputted.

Further, according to the embodiment, as shown by FIG. 3A, there are used high voltage tolerant MOS transistors for the MOS transistors 43, 44 and 45 which may be applied with high voltage for writing.

By the flash memory and the circuit as described above, electric writing and reading operation are carried out.

Figure 4B:
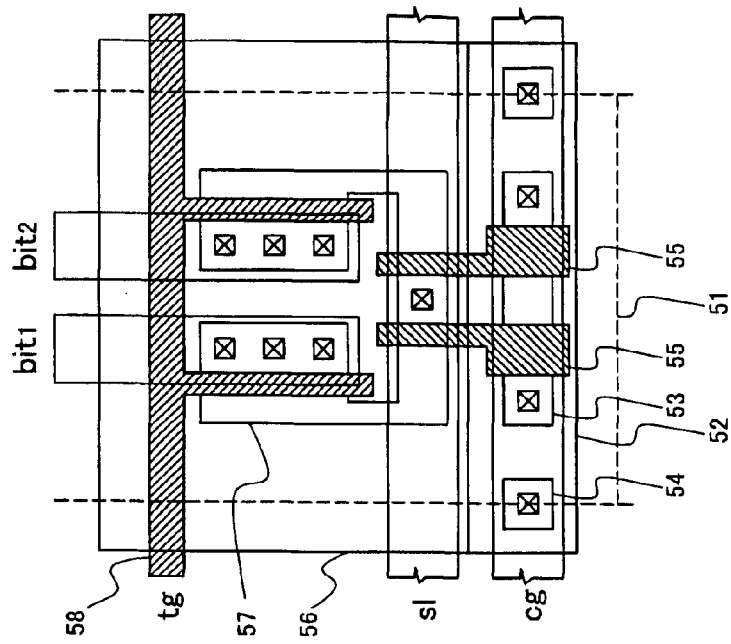
FIG. 4A is a circuit diagram of program bits according to the present invention and FIG. 4B is a diagram indicating layout of the flash memory cell.
Figure 4A:
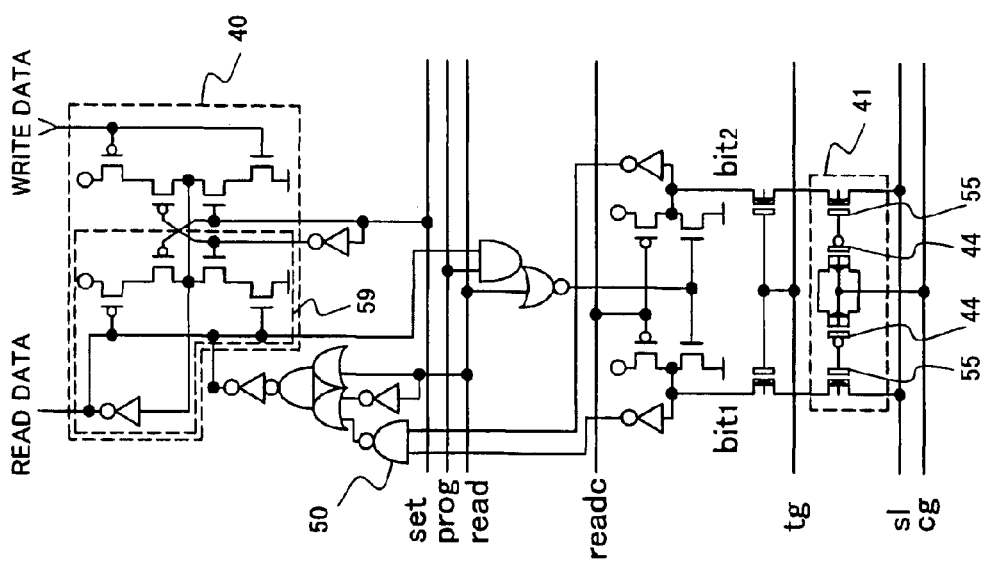

Constitutions shown in FIGS. 4A and 4B promote certainty and reliability in reading a flash memory cell relative to the circuit of FIG. 3, FIG. 4A shows an embodiment of a circuit of program bits and FIG. 4B shows an embodiment of layout of a flash memory cell portion.

The flash memory cell holds data by accumulating electrons at the floating electrode Vf. In the case of the invention, the floating electrode also uses a gate electrode having the same structure as that of a gate electrode of a normal MOS transistor and accordingly, a special oxide film is not used for the gate oxide film for accumulating electrons. However, because thereof, depending on elements, it is conceivable that leakage current of the oxide film is large and accumulated electric charge passes through the oxide film. According to the embodiment, in view of such a situation, there is provided a system promoting reliability by constituting 1 bit by using 2 cells of flash memory cells.

The flash memory cell 41 is constituted of 2 cells. Systems of reading and writing are the same as those of the embodiment shown by FIG. 3. In writing operation, when write data is "0", both of the two memory cells do not carry out operation of injecting electrons and when write data is "1", both of the two memory cells carry out operation of injecting electrons and elevate the threshold of the MOS transistor 44, respectively.

In reading operation, data read from the two memory cells 44 provide a logical sum by a gate 50. That is, when read data are "0" and "0", outputted read data is "0" and when the read data are "0" and "1", "0" and "1" and "1" and "1", the outputted read data is "1". By constructing such a constitution, there can be constituted program bits which do not output wrong data even when electrons accumulated on one floating electrode of the flash memory cell pass through the oxide film by some cause such as defect of the oxide film and the threshold is lowered, and the reliability can be promoted.

Further, according to the embodiment, read data uses a static register 59 using a flip flop circuit instead of a dynamic type latch holding electric charge at a capacitor (further, in reading operation, a set signal is "L"). This is because the read data of the program bit must be always effective so far as power source is inputted to a semiconductor chip.

In FIG. 4B, numeral 51 designates a boundary of program bits. Further, 52 designates an N well constituting the gate of the flash memory cell, 53 designates a P$^+$ diffusion layer area, 54 designates an N$^+$ diffusion layer area, 55 designates a floating electrode, 56 designates a P well, 57 designates an N$^+$ diffusion layer area and 58 designates a gate electrode constituting a threshold gate tg. As shown by the layout diagram, even when there are two floating electrodes, the N well 52 constituting the gate electrode of the flash memory cell becomes common in the circuit diagram and accordingly, the N well may not be divided and the two flash memory cells can be constituted by a minimum area. The constitution stays the same also in the case of aligning multiple bits of program bits as shown by the following embodiment.

Further, even in the case of the system, the circuit scale of the program bit is large and there poses a problem of increasing an occupied area, however, when the program bits are used for redundancy, there can be constituted a size hardly increasing the chip area substantially.

Figure 5B:
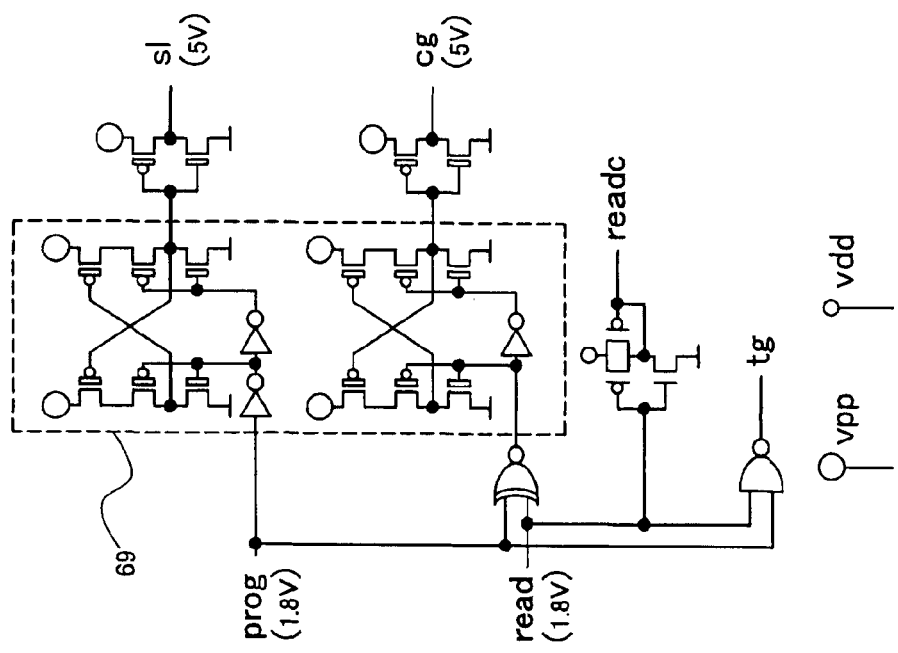
FIG. 5A is a schematic diagram aligning the program bits in 7 bits in parallel and FIG. 5B is a diagram showing a portion of a circuit in a control circuit.
Figure 5A:
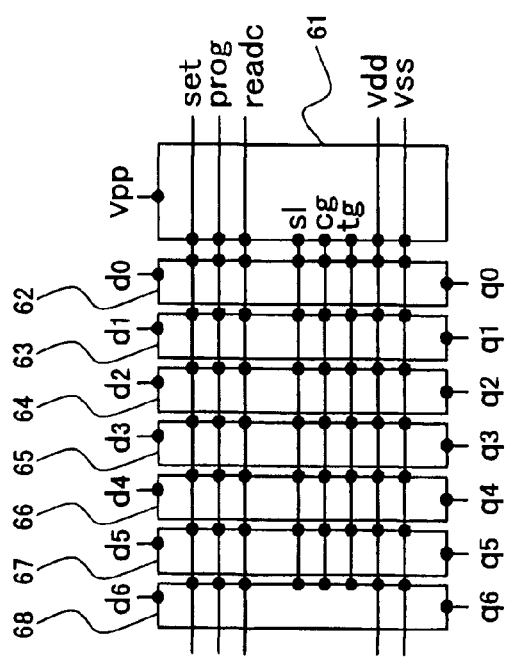

FIG. 5A shows an embodiment in which the program bits shown in FIG. 4A are aligned in 7 bits in parallel and FIG. 5B shows a portion of a circuit in a control circuit.

According to the embodiment, numeral 61 designates a control circuit, numerals 62 through 68 designate program bits aligned in parallel and 69 designates a level shifter circuit. Further, the respective bits 62 through 68 are aligned in a transverse direction and the control circuit 61 is arranged contiguously to the line. Write data are designated by notations d0 through d6 and read data are designated by notations q1 through q6. Further, notation Vdd designates low voltage, notation Vss designates ground voltage and notation Vpp designates high voltage necessary for writing data to the flash memory cell.

Also in the case of the embodiment, the control gate electrode is common to all of the program bits and accordingly, the N well can be made common. Therefore, the embodiment of FIG. 5 can be realized by the layout diagram shown by FIG. 4B as it is.

Other than the power source voltages, notations set, prog, read, tg, sl and cg designate control signals necessary for writing and reading data to and from the flash memory. The power source voltages and the control signals are common signals when the circuits are aligned in parallel. Therefore, by generating the necessary control signals together by the control circuit 61 and wiring to cross the flash memory cells aligned transversely from the control circuit 61 and peripheral circuits, multiple bits can be constituted.

Further, among the control signals, in the cases of signals cg and sl, it is necessary to generate high voltage of 5V. As shown by FIG. 5B, indicating a portion of the control circuit, theses signals can be generated by calculating prog and read signals having an amplitude of, for example, 1.8V and passing the signals through the level shifter circuit 69 using Vpp for the power source.

By the embodiment, even in the case of aligning multiple bits, the program bits can be constituted compactly.

Figure 6:
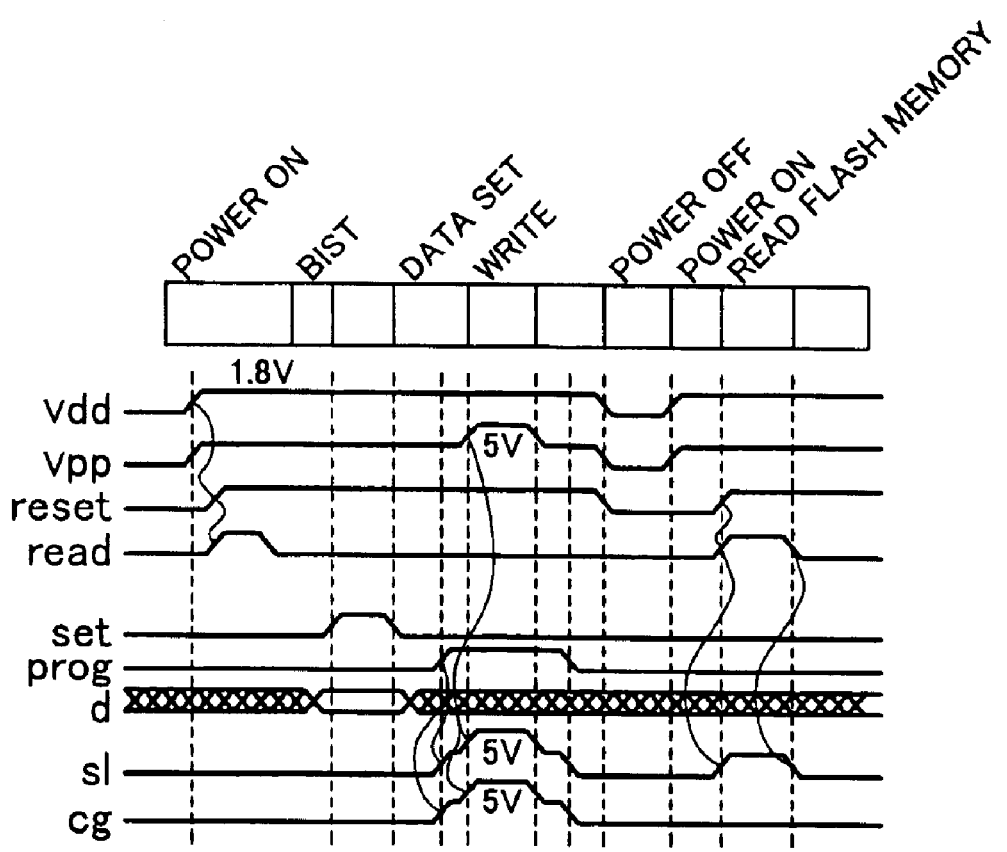
FIG. 6 is a diagram showing waveforms of respective signals.

FIG. 6 is a diagram showing waveforms of respective signals. According to the embodiment, there is shown a series of operation from inputting power source to the semiconductor integrated circuit, writing to the program bits and reading the program bits. Actually, operation of writing data to the program bits up to making power OFF is carried out by a semiconductor maker and operation at and after power ON at a second time is operation which is executed by the user in using the chip.

First, when power source is made ON, the power source Vdd and the power source Vpp are set to 1.8V. Thereafter, the BIST unit issues address (redundant address) written to the program bits and generates the data signal d. Next, by asserting the set signal, the generated data signal d is inputted to the register. The writing operation is started by asserting the prog signal. When the prog signal is asserted, the sl and cg signals become the same voltage as Vpp. Further, by making voltage Vpp 5V, the sl and cg signals become 5V and writing to the flash memory cell is executed. Thereafter, the power source is brought into an OFF state.

Next, when the power source is inputted, the reset signal is generated in the integrated circuit and the read signal is made by the reset signal. By the read signal, operation of reading data from the flash memory cell is started and the read data is transmitted to the register. As shown by FIG. 6, voltage is applied to the flash memory cell only in resetting.

The read data is held so far as power source is inputted to the register as shown by FIG. 4. Thereby, there is achieved an effect of preventing breakage of accumulated information by applying voltage for a long period of time which is a phenomenon particular to the flash memory cell.

Figure 7:
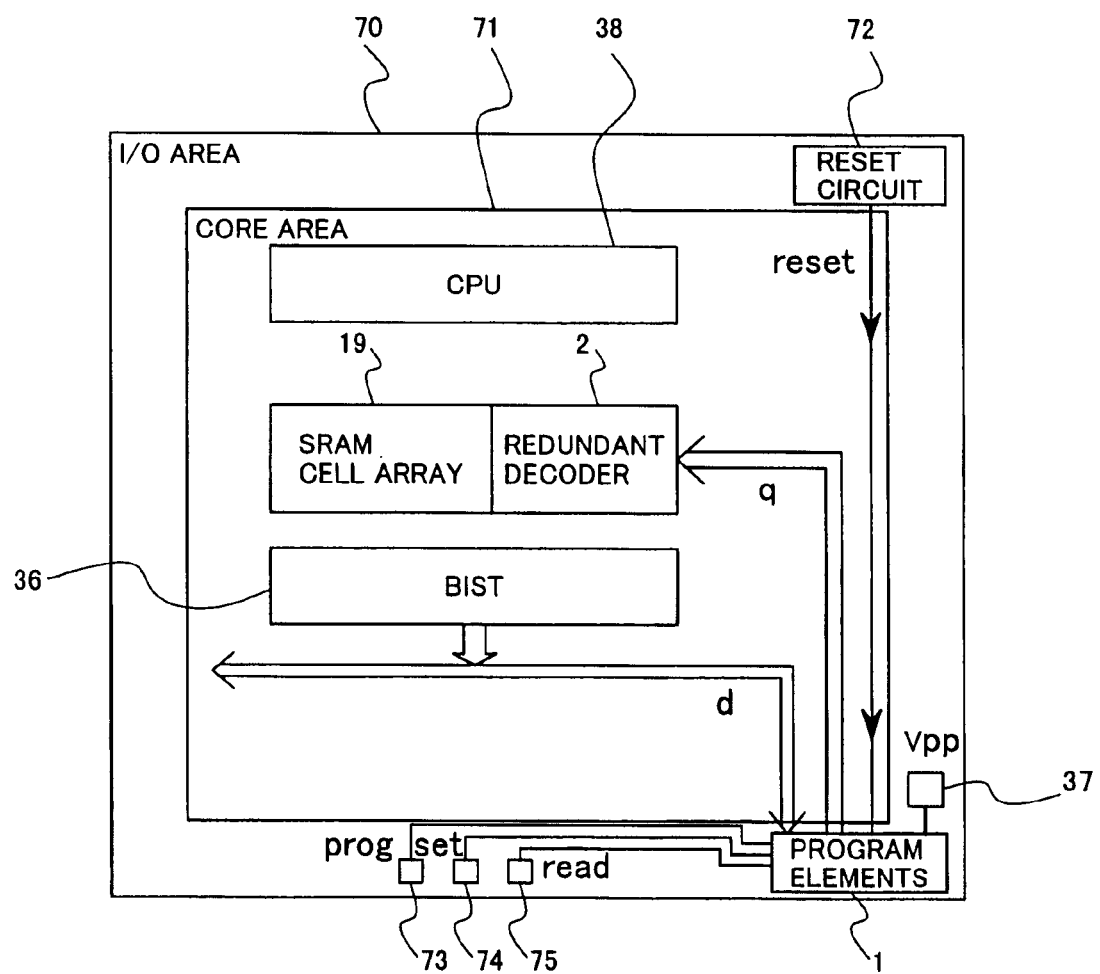
FIG. 7 is a diagram showing a chip of an embodiment of a semiconductor integrated circuit according to the present invention.

FIG. 7 is a drawing showing the chip of the embodiment of the semiconductor integrated circuit according to the present invention. Numeral 70 designates the semiconductor integrated circuit, 71 designates a core area, 72 designates a reset circuit and numerals 73 through 75 designate pads for inputting control signals.

The address signal d to be written to the program bits is generated by the BIST unit 36 and is transmitted to the program elements. Further, the address signal q for redundancy is transmitted from the program elements to the redundant decoder 2. Meanwhile, the reset circuit 72 generates the control signal reset necessary for reading control of the program elements 1. The control signals prog, set and read can be inputted from outside via the exclusive pads 73 through 75 for inputting the control signals.

Figure 8:
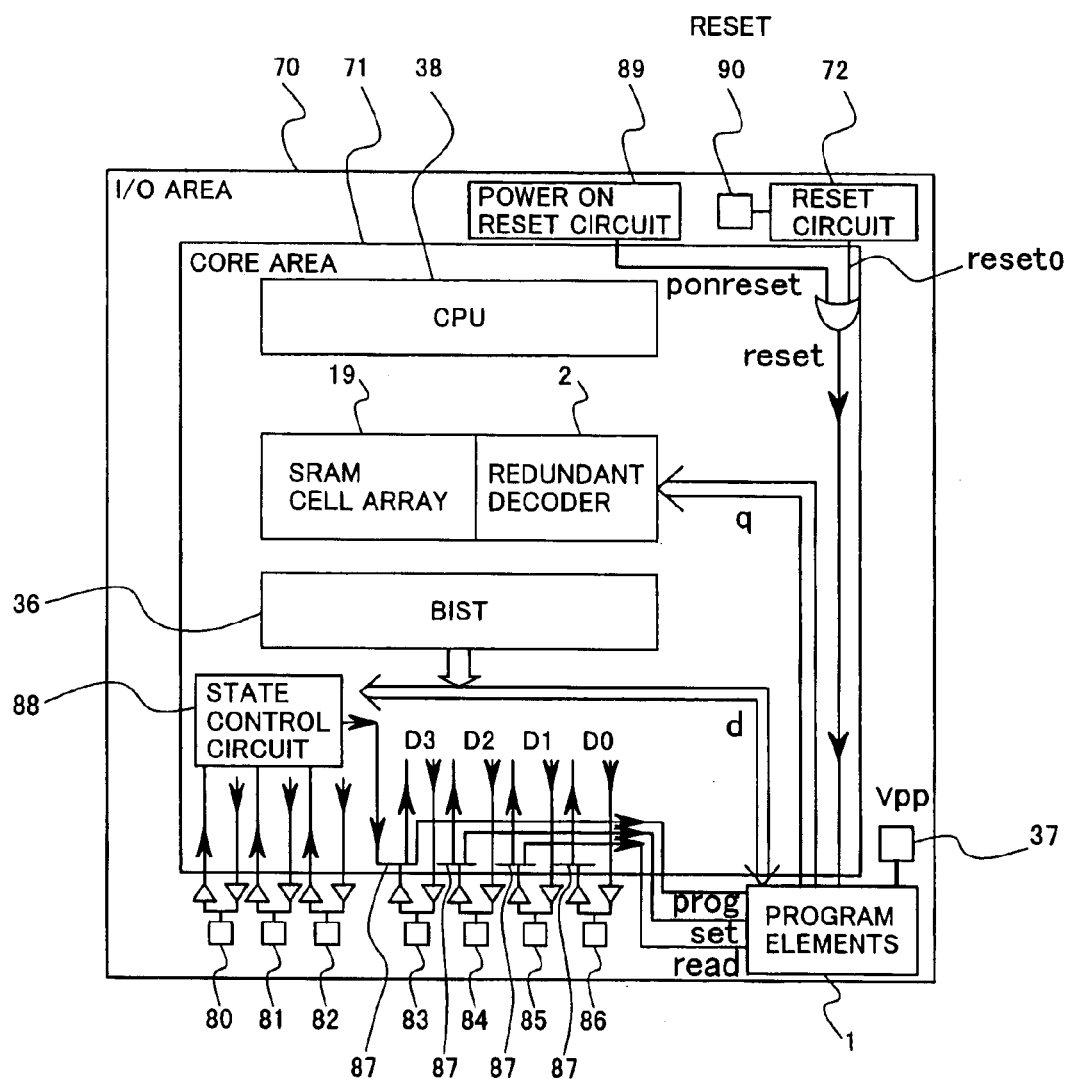
FIG. 8 is a diagram showing a chip of an embodiment of a semiconductor integrated circuit according to the present invention.
Figure 9:
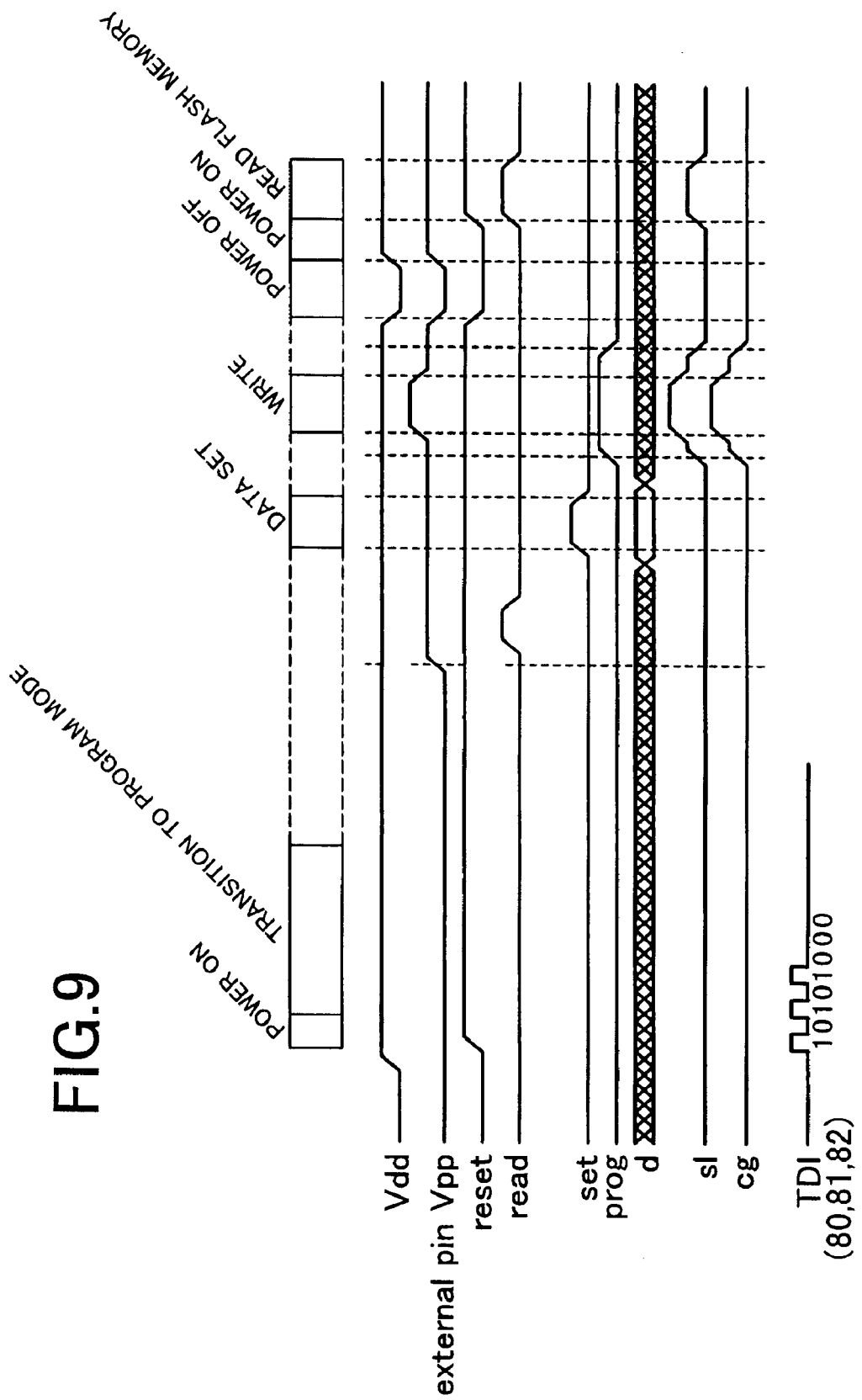
FIG. 9 is a diagram showing waveforms of respective signals.

According to the example of FIG. 7, there are provided the exclusive pads for the control signals and the control signals are inputted therefrom. In this case, the number of the pads may be increased and the chip area may be increased. Hence, according to the example of FIG. 8, pads designated by numerals 83 through 85 are shared along with other signals. That is, D1 and the read signal, D2 and the set signal and D3 and the prog signal respectively share the pads 85, 84 and 83. By using switches 87, in programming, the program elements 1 are controlled such that the shared signals reach the core area in normal operation. Control of these is executed by decoding inputted signals 80, 81 and 82 by a state control circuit 88. The pads are connected with an input buffer circuit and an output buffer circuit and data and control signals are inputted and outputted via the circuits. Further, portions arranged with input and output circuits including the buffer circuits and an outer side thereof are displayed here as an I/O area. An explanation will be given of operation of inputting signals in the example of FIG. 8 in reference to FIG. 9.

That is, the state control circuit 88 inspects the signals 80, 81 and 82 and when there is inputted a signal pattern for executing a previously determined program (TDI10101000 in this example), signals inputted to the pads 83 through 85 by switching the switches 87, are transmitted to the program elements. The signal pattern (TDI) is inputted from the tester.

Meanwhile, when data is read from reset program bits, the operation is carried out by using the reset signal. When power source is inputted, a power ON reset circuit 89 generates a ponreset signal and a reset circuit 72 generates a reset 0 signal when an RESET signal is inputted from a reset pin 90. By calculating a logical sum of the signals, a reset signal is made. That is, when power source is inputted or the RESET signal is inputted from outside, the reset signal is generated and by the signal, there is carried out operation of reading information from the flash memory cell. The read data is transmitted to the register and immediately thereafter, voltage applied to the flash memory cell is made OFF.

Figure 21:
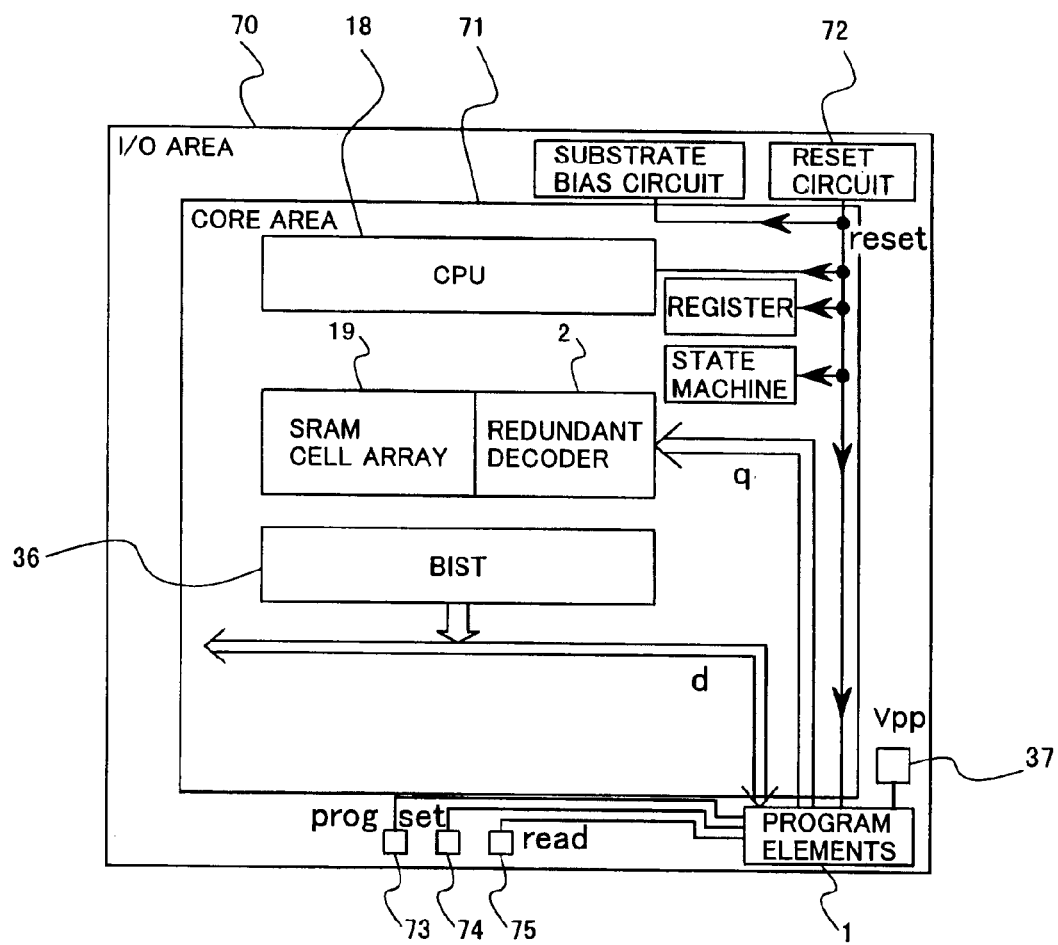
FIG. 21 is a diagram for explaining a function of a reset signal.

Further, the reset signal not only constitutes a trigger of operation of reading information from the flash memory cell but also naturally achieves other function in the semiconductor integrated circuit as shown by FIG. 21 (for simplicity, the power ON reset signal is omitted). For example, the reset signal is used for resetting CPU 18 to an initial state and initializing a register or a state machine. Further, in the case of a microprocessor having a function of reducing power consumption on standby by controlling substrate bias, the reset signal is utilized also for initializing a state of the substrate bias.

According to the embodiment, necessary control signals can be inputted without particularly increasing control signal pins necessary for controlling the program bits.

Figure 11:
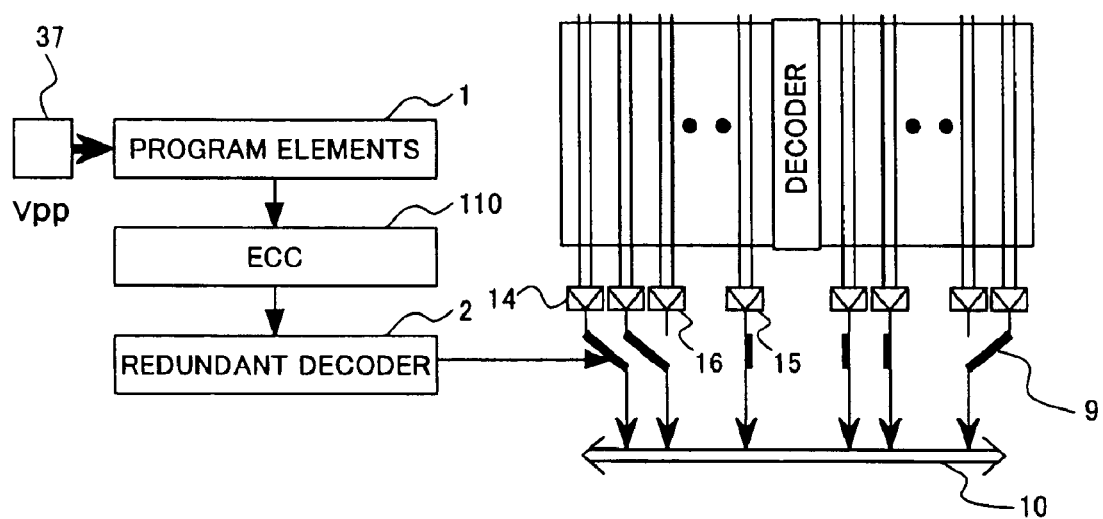
FIG. 11 is a block diagram showing other embodiment of the present invention.
Figure 12A:
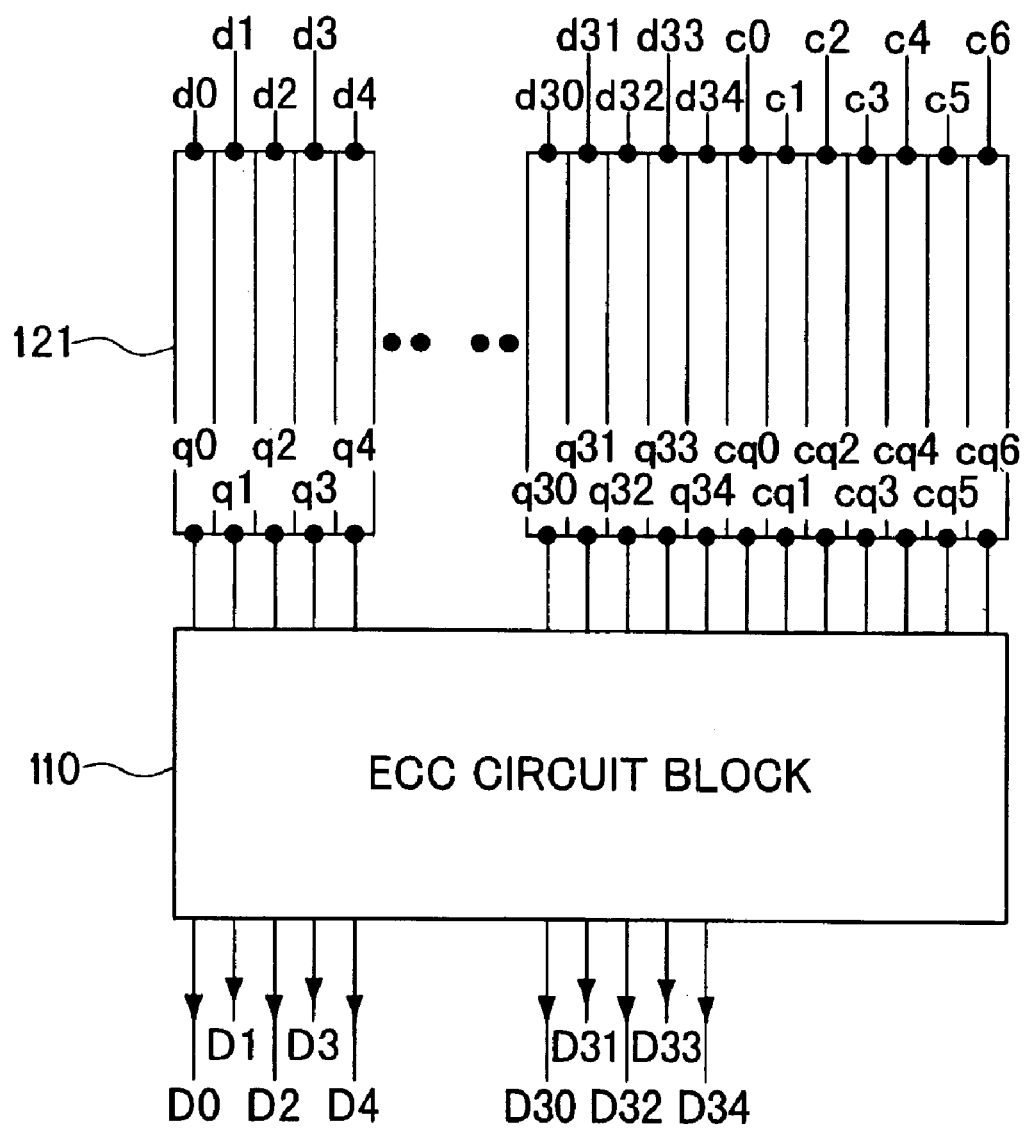
FIG. 12A is a schematic diagram showing a relationship between program bits and an ECC circuit block.
Figure 12C:
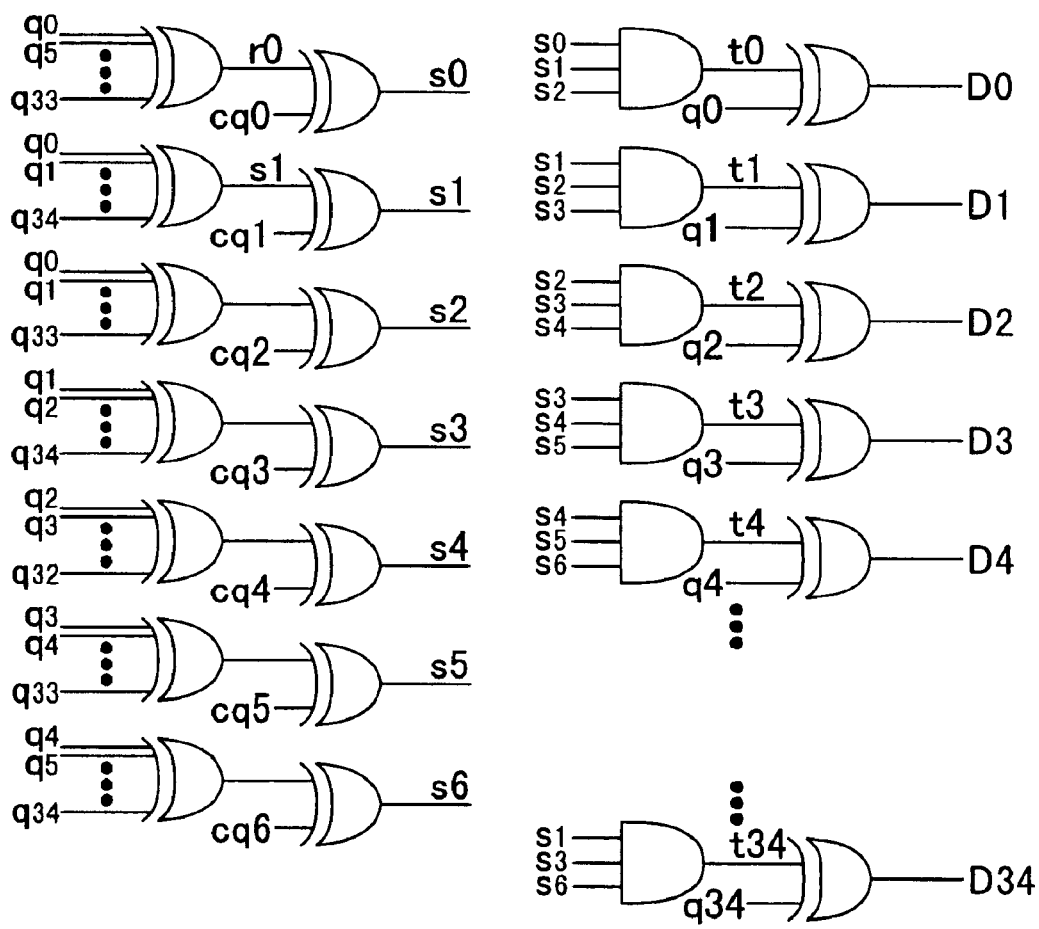

FIG. 11 shows an embodiment promoting reliability of data written to program elements. According to the embodiment, the program elements 1 execute error correction by an error correcting circuit (ECC circuit) 110 with regard to write data, thereby, even when 1 bit stored to the program elements 1 outputs wrong data, redundancy is possible by outputting accurate data. FIGS. 12A, 12B and 12C show a constitution example of the error correcting circuit 110.

Numeral 121 designates program bits and 110 designates an ECC circuit block. According to the embodiment, data inputted to the program bits are redundant address information d0, d1 through d34 and check bits c0 through c6. The check bits are formed based on the data d0 through d34 to be inputted for inputting data prior to inputting data to the program elements 1. The check bits c0 through c6 can be generated in the BIST circuit or CPU. The input data (redundant address information and check bits) are firstly held in registers of the program bits and further written to the flash memory.

Meanwhile, in resetting, data is read from the flash memory, held in the registers and data q0 through q34 and cq0 through cq6 are outputted to the ECC circuit block. The ECC circuit block 110 executes error correction with regard to output data and outputs final data D0, D1 through D34. At this occasion, even there is 1 bit error in bits up to the data q0, q1 through q34 read from the flash memory, the error can be corrected by utilizing the data cq0 through cq6 constituting parity data and corrected data can be outputted.

FIG. 12B is a table showing an example of allocating the parity data. That is, the parity bit c0 is provided with exclusive OR with the data d0, d5, d6, d7, d11, d13, d14, d17, d20, d21, d23, d27, d28, d31 and d33 and the parity bit c1 is provided with exclusive OR with the data d0, d1, d6, d7, d8, d12, d14, d15, d18, d21, d22, d24, d29, d32 and d34. The other parity bits are respectively as shown by the table.

FIG. 12C shows the ECC circuit block when the parity bits are under the relationship shown by FIG. 12B. First, there is generated r0 constituting exclusive OR of the data q0, q5, q6, q7, q11, q13, q14, q17, q20, q21, q23, q27, q28, q31 and q33. Since r0 is provided by a calculation similar to the parity bit c0, r0 and cq0 are to be provided with the same value inherently. Hence, by calculating exclusive OR of r0 and cq0, it is inspected whether all of the bits of q0, q5, q6, q7, q11, q13, q14, q17, q20, q21, q23, q27, q28, q31 and q33 and cq0, are correct. When r0=cq0, s0 bit is "0" and when r0cq0, the bit is "1". That is, when there is 1 bit of error in q0, q5, q6, q7, q11, q13, q14, q17, q20, q21, q23, q27, q28, q31 and q33, s0 bit becomes "0" and becomes "1" when there is not the error. Similarly, other s1, s2 through s6 bits are formed in accordance with the table of FIG. 12B. Based on the s bits generated in this way, the final output data D0, D1 through D34 are formed. In order to provide D0, by calculating logical sums of s0, s1 and s2 constituting check bits of d0, t0 is made. When there is not an error in data of q0, t0 is "0" and when there is an error, "1" is outputted. By calculating exclusive OR of t0 and q0, even when q0 is error, the error is corrected and D0 having a correct value can be generated. Other bits can similarly be generated.

According to the embodiment, by using the ECC circuit block, even when there is error in 1 bit in the program bits, the error can be corrected and the correct value can be outputted. Thereby, the reliability of the redundant circuit according to the present invention can be enhanced.

Figure 13B:
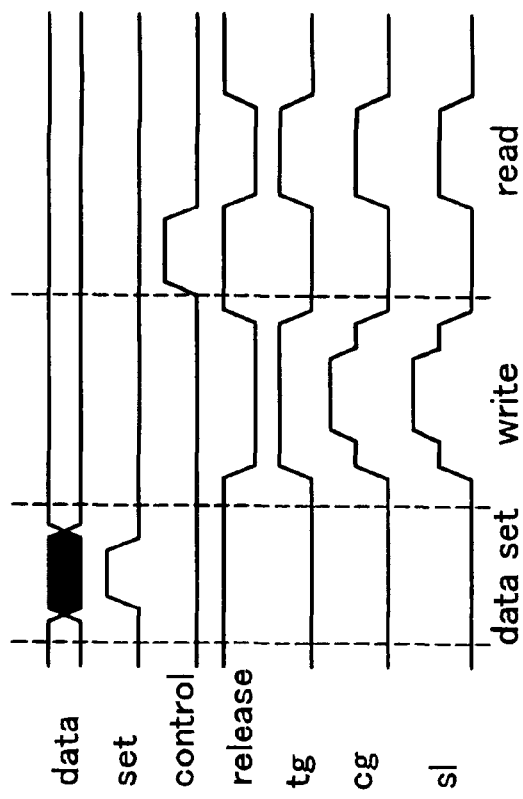
FIG. 13A is a circuit diagram of program bits according to the present invention and FIG. 13B is a waveform diagram of input signals in the operation.
Figure 13A:
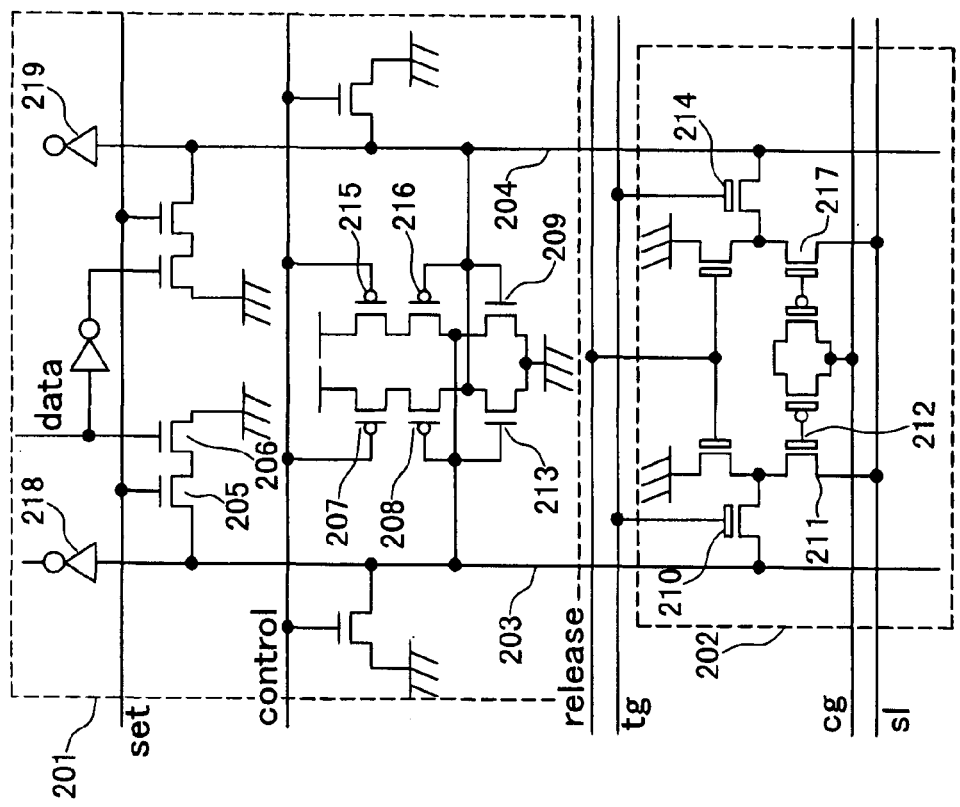

FIG. 13A is a circuit diagram of 1 bit data of a flash memory according to other embodiment of the present invention and FIG. 13B is a waveform diagram of input signals in operation. Numeral 201 designates a circuit used for reading and writing of memory and 202 designates a flash memory cell of 1 bit.

Operation in writing is as follows. Further, in a normal state, respective control signals of set, tg, cg, sl and control become L and a release signal becomes H. First, the data signal is inputted with data written to the memory cell and the signal set is made H at a time point of determining input. Thereby, nodes 203 and 204 are set with write data. In this case, when the write data is 1, the data signal is inputted with H, the set signal is inputted with H, the control signal is inputted with L, thereby, transistors 205 and 206 are conducted and the node 203 becomes L. Thereby, a transistor 208 is made ON, the node 204 becomes H by a path of the transistors 207 and 208 and data of 1 is accumulated in a buffer constituted of the nodes 203 and 204.

Next, data is actually written to the flash memory. In writing, the release signal is made L and the tg signal is made H. After determining the input, there is applied voltage for writing the flash memory to the signals sl and cg. For example, when the signals sl and cg are applied with 5V in a state in which 1 is written to the register, a transistor 210 constituting a transfer gate with a transistor 211 and a transistor 209 of the flash memory are conducted and current flows in the transistors 211, 210 and 209. At this occasion, hot electrons are generated at a channel of the transistor 211 since current flows in a state in which drain voltage of the transistor 211 is high and electrons are injected to a floating gate 212 by exceeding a barrier of an oxide film. Thereby, threshold voltage of the transistor 211 is elevated. Meanwhile, a transistor 213 is not made ON since the node 203 becomes L. Therefore, current does not flow in the transistor 213 and threshold voltage of a transistor 217 remains unchanged. When the memory cell 202 is brought into the state, it is regarded that 1 is written. Conversely, in writing 0, the threshold voltage of the transistor 211 remains unchanged and the threshold voltage of the transistor 217 is elevated. The state is regarded as a state in which 0 is written.

In reading, the signal control is inputted with H and potentials of the nodes 203 and 204 are made 0V. Successively, the signal cg is applied with voltage of H to a degree of not generating hot electrons, for example, 1.8V. Further, simultaneously, the signals control and release are applied with voltage of L and the signals sl and tg are applied with voltage of H. When the signal cg is applied with voltage of H in a state in which 1 is written to the memory cell (transistor 211 is under high threshold voltage, transistor 217 is under low threshold voltage), the transistor 217 is conducted and the transistor 211 is not conducted. At this occasion, the node 204 becomes ground potential by being grounded by the path of transistors 214 and 217, a transistor 216 is conducted, current flows by a path of the transistors 215 and 216 and the node 203 which is not connected to the ground becomes the state of H. Thereby, 1 is read and is outputted via an inverter 218. Conversely, when the value of the memory is 0, by conducting the transistor 211 by potential of the signal cg, 0 is read by making the node 203 L and the node 204 H.

Further, when 1 is written to the memory cell, there is conceivable a case in which the threshold voltage of the transistor 211 which has been elevated once, is lowered by elapse of time or write failure and the transistor 211 is conducted even when the voltage to the degree of not generating hot electrons is applied to the signal cg. In this case, in the initial state, potentials of the nodes 203 and 204 become 0V and therefore, the transistors 208 and 216 are conducted, the signal control is applied with potential of L, thereby, current flows via paths of the transistors 207, 208, 214 and 217 and the transistors 215, 216, 210 and 211 from power source. At this occasion, the threshold voltage of the transistor 211 becomes higher than the threshold voltage of the transistor 217 and accordingly, resistance of the transistor 211 becomes higher than resistance of the transistor 217. Therefore, voltage drop by resistances of the transistors 210 and 211 becomes larger than voltage drop by resistances of the transistor 214 and 217 and the potential of the node 203 becomes higher than the potential of the node 204. Thereby, resistance of the transistor 209 becomes higher than resistance of the transistor 213 and potential difference between the node 203 and the node 204 is further widened. Thereby, finally, the node 203 becomes H, the node 204 becomes L and data of 1 is read. An inverter 219 is a dummy circuit for equivalently maintaining parasitic capacitances of the nodes 203 and 204.

According to the circuit, by connecting a flash memory circuit equivalent to the circuit 201 in the longitudinal direction via the node 203 and the node 204, there can also be constituted a memory circuit in a shape of an array having one circuit of reading and writing of memory with regard to several bits of memory in the longitudinal direction.

Figure 14A:
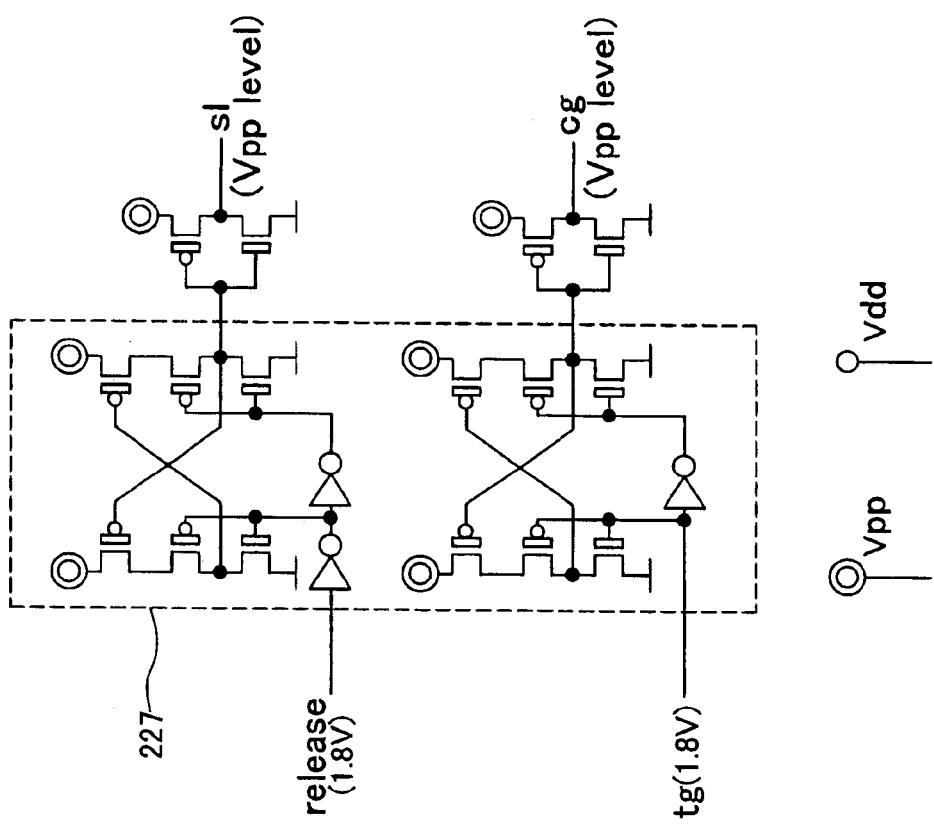
FIG. 14A is a schematic diagram aligning program bits of FIG. 13 in pluralities of bits in parallel and FIG. 14B is a diagram showing a portion of a circuit in a control circuit.
Figure 14B:
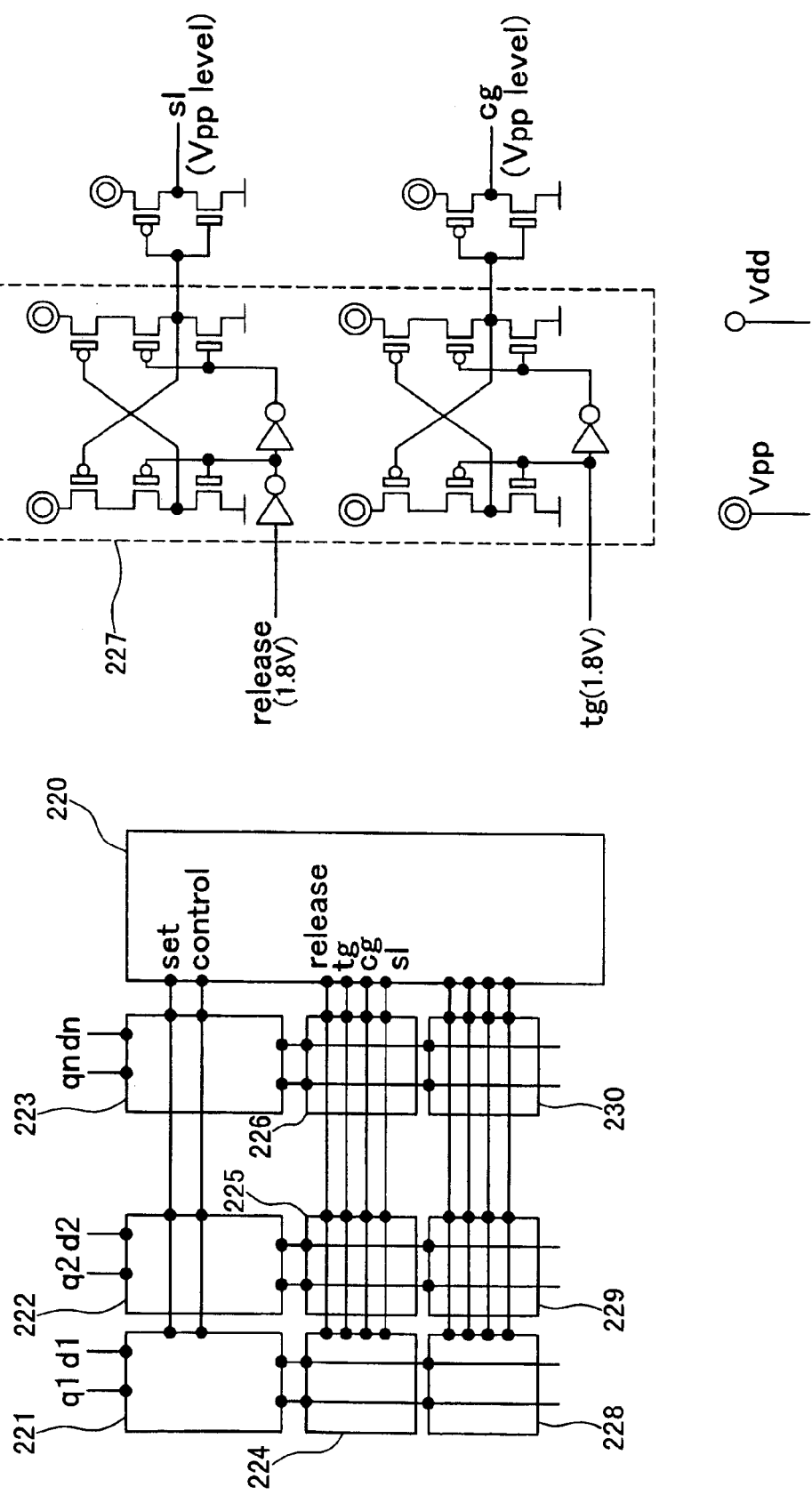

FIG. 14A shows an embodiment in which circuits shown by FIG. 13 are aligned in parallel by several bits and FIG. 14B shows a portion of a control circuit.

According to the embodiment, numeral 220 designates a control circuit, numerals 221 through 223 designate circuits aligning the read circuits 201 of FIG. 13 in parallel, numerals 224 through 226 designate circuits aligning flash memory circuits 201 in parallel and 227 designates a level shifter circuit. The respective bets 221 through 223 and 224 through 226 are aligned in the transverse direction and the control circuit is arranged contiguous to the line. Data of writing ranges from d1 through dn and read data ranges from q1 through qn. Further, notation Vdd designates low voltage power source, notation Vss designates ground potential and notation Vpp designates voltage source changed to high voltage in writing data to the flash memory cell. Also in the case of the embodiment, control electrodes are common to all of the program bits and therefore, the N well can be made common and when the layout shown in FIG. 4 is aligned in the transverse direction, the embodiment of FIG. 14A can be realized. Further, the signals set, control, release, tg, cg and sl constituting control signals are signals for controlling the flash memory cell and reading and writing circuits and are common signals when the circuits are aligned in parallel in the transverse direction. Therefore, by generating the control signals by the control circuit 220 and wiring thereof to cross the flash memory cell in the transverse direction, multiple bit constitution can be constructed. Further, among the control signals, the signals cg and sl need high voltage for generating hot electrons. As shown by FIG. 14B, the signals are generated by the level shifter circuit 227 using the power source Vpp capable of changing the signals tg and release having H level of 1.8V and power source potential to high voltage. By the embodiment, there can be constituted program bits having small circuit area even in the case of aligning multiple bits. Further, as designated by numerals 228 through 230 in FIG. 14A, there can be constructed a constitution of aligning the flash memory cell circuits in the longitudinal direction while sharing the read/write circuits 221 through 223 by bits in the longitudinal direction.

Figure 15B:
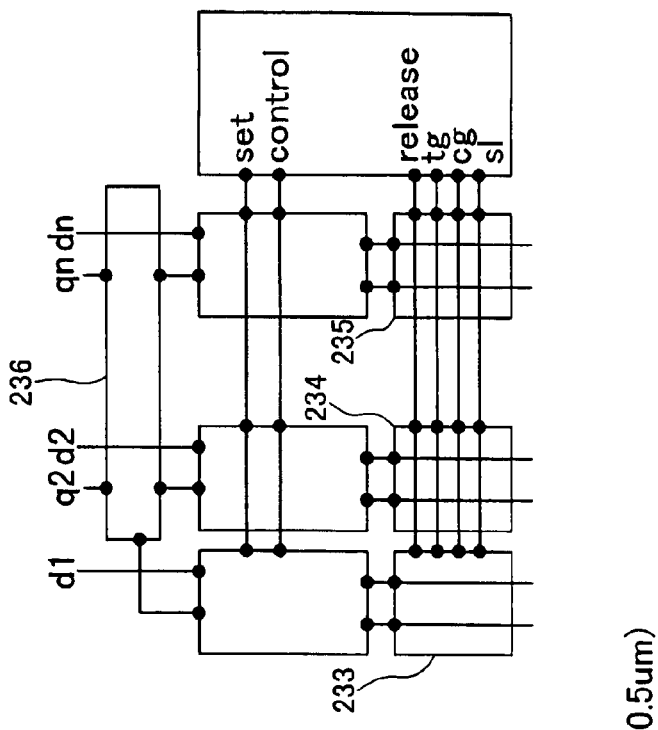
FIG. 15A is a circuit diagram of program bits according to the present invention and FIG. 15B is a schematic diagram aligning program bits in pluralities of bits in parallel.
Figure 15A:
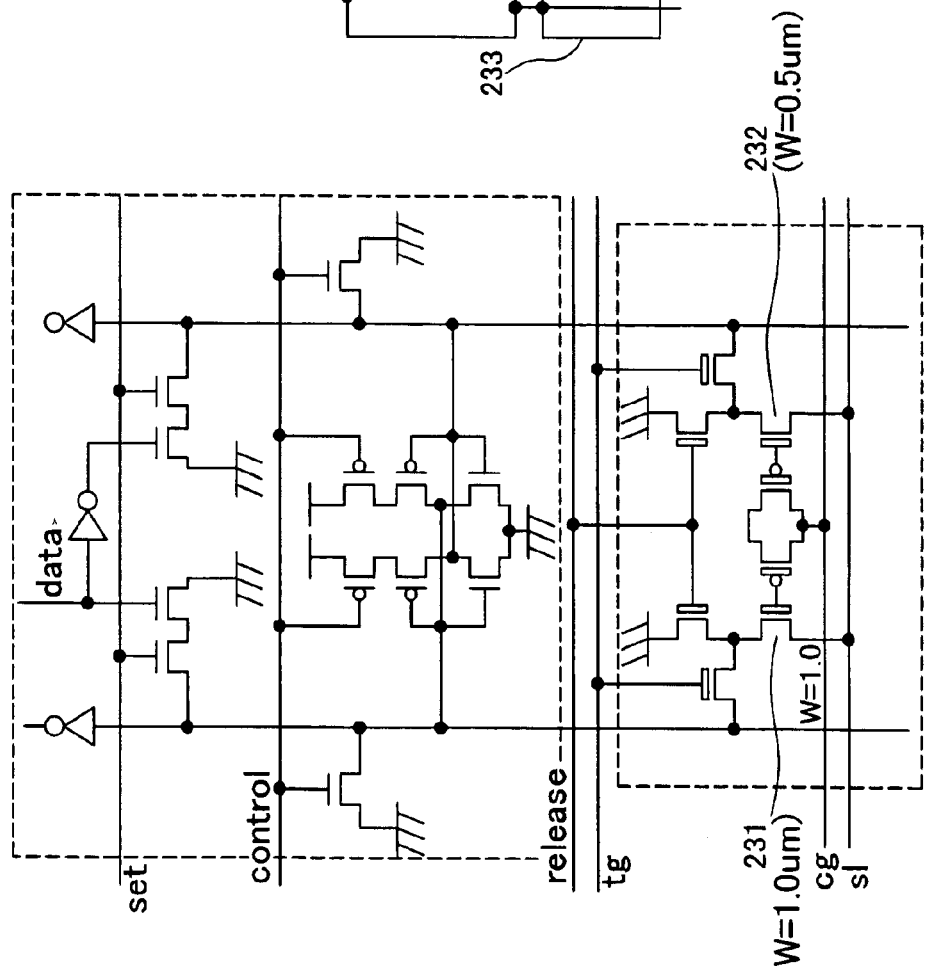

FIGS. 15A and 15B show a modified example of the circuit shown by FIG. 13 and FIG. 14. According to the embodiment, a size of a gate width of the transistor 232 is made smaller than that of a transistor 231. The circuits of FIG. 13 and FIG. 14 are devoid of information of whether a redundant circuit is used since output is not determined in a state in which nothing is written. According to the circuit, when data is intended to read in the state in which nothing is written, since current flowing in the transistor 231 is larger than current flowing in the transistor 232, L is read. Conversely, when reading is carried out in a state written with H, H is outputted. For example, when a gate length of the transistor 231 is set to 1 μm and a gate length of the transistor 232 is set to 0.5 μm, in reading, the current flowing in the transistor 232 becomes a half of the current flowing in the transistor 231 and L is read from the memory cell.

The memory cell circuit is arranged at a portion 233 of FIG. 15B and the memory cell circuit shown by FIG. 13 is arranged at portions 234 and 235. The output of the memory cell 233 is inputted to a circuit 236. The circuit 236 becomes a circuit in which when input from the memory cell 233 is L, all of output is made L and when input is H, outputs of the memory cells 234 and 235 are outputted to portions q2 through qn as they are, thereby, in a state in which data is not written to the flash memory, all bits L are outputted and in a state in which data is written thereto, written data is outputted. Thereby, in the state in which data is not written to the flash memory, by outputting all bits L, it is possible not to use the redundancy function of memory.

Figure 16B:
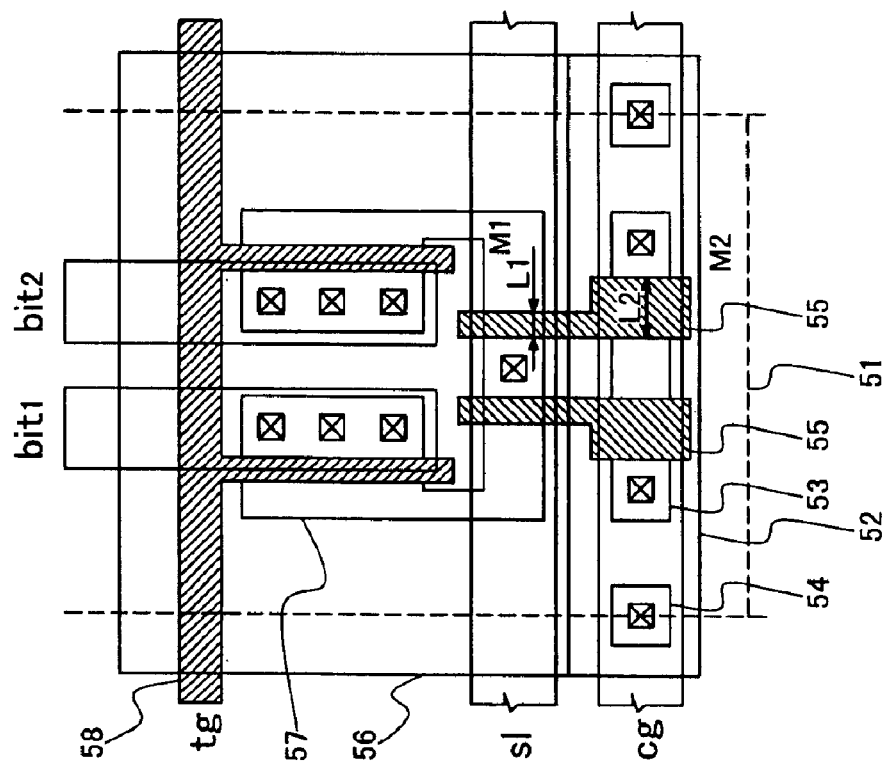
FIG. 16A is a sectional view of a chip and FIG. 16B is a layout view of a memory cell.
Figure 16A:
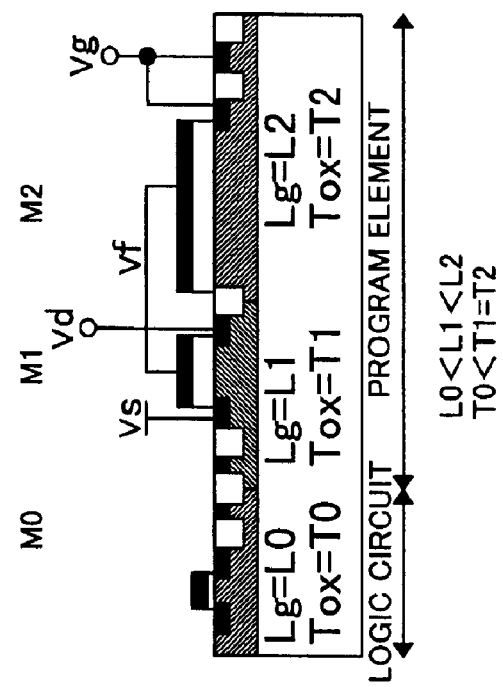

A detailed explanation will be given of the structure of the flash memory cell shown in FIGS. 1A, 1B and 1C and FIG. 4B in reference to FIGS. 16A and 16B. In a sectional view shown in FIG. 16A, a gate length Lg of a transistor of a logical circuit (core area) is designated by L0 and a thickness Tox of a gate oxide film is designated by notation T0. Further, in a flash memory portion (program element), a gate length Lg of a transistor M1 is designated by notation L1, a thickness Tox of a gate oxide film is designated by notation T1, a gate length Lg of a transistor M2 is designated by notation L2 and a thickness Tox of a gate oxide film is designated by notation T2. At this occasion, it is necessary that the gate oxide film thickness of the flash memory portion is thickened such that electric charge accumulated in the gate electrode Vf is not discharged by flowing tunnel leakage current through the gate oxide film. Meanwhile, the gate oxide film thickness of the logic circuit can be thinned since circuit operation is not directly influenced even when the tunnel leakage current flows. Therefore, there is established a relationship of T0<T1=T2. Or, there is satisfied a relationship of (T1−T0)>(T1−T2) (however, absolute values).

Further, with regard to the gate length of the logic circuit, since the gate oxide film thickness is thinned, a reduction in the threshold value by a short channel effect becomes small and the gate length can be reduced. Meanwhile, it is necessary that the gate length of the transistor Ml of the flash memory is prolonged in accordance with thickening the gate oxide film thickness. Further, it is necessary that the gate length of the transistor M2 is further increased such that a change in voltage of a gate electrode Vg efficiently is transmitted to a floating gate electrode Vf. As a result, with regard to the gate length, there is established a relationship of L0<L1<L2.

Further, as shown by FIG. 1B, the program elements 1 are arranged at the I/O portion and the gate oxide film thickness of the flash memory is made a film thickness equal to that of the gate oxide film of the transistor used in the input and output circuits of the integrated circuit within a range of tolerant error caused by process dispersion. Generally, in the input and output circuits, there is used a gate insulating film thicker than the transistor in the core area for promoting electrostatic tolerant voltage. In this way, by making the gate insulating film thickness of the flash memory cell common to the gate oxide film thickness of the transistor of the input and output circuits, there can be constituted the flash memory cell having further excellent information holding function without complicating the fabrication process.

Figure 17:
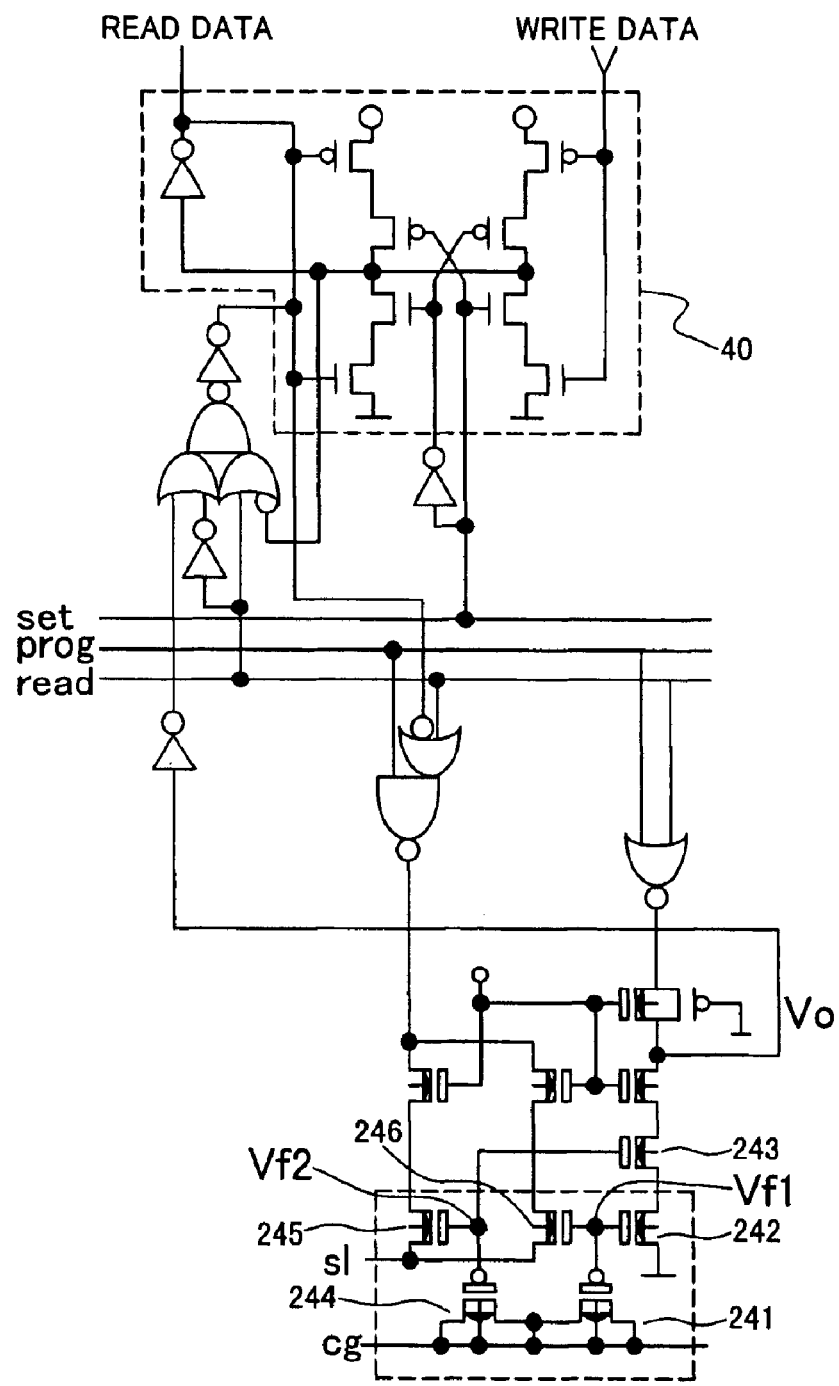
FIG. 17 is a circuit diagram of program bits according to the present invention.

Further, the circuit of the flash memory according to the present invention is not limited to the above-described. FIG. 17 is a circuit diagram of other embodiment of a flash memory circuit according to the present invention.

A flash memory cell according to the embodiment is constructed by a constitution in which a transistor 242 having a floating gate Vf1 and a transistor 243 having a floating gate Vf2, are connected in series. According to the constitution, when a control gate Cg is made ON, potentials of the floating gates Vf1 and Vf2 are elevated via transistors 241 and 244. At this occasion, in a state in which electrons are not injected to the floating gates Vf1 and Vf2, both of the transistors 242 and 243 are brought into the ON state, current flows and potential of Vo is lowered. Meanwhile, when electrons are injected at either of the floating gates Vf1 and Vf2, either or both of the transistor 242 and 243 connected in series are brought into the OFF state and therefore, high potential is outputted for Vo. In this way, according to the embodiment, by using the flash memory having the two floating gates, 1 bit of the program elements is constituted and reliability of data can be promoted.

According to the embodiment, injection of electrons to the floating gate Vf1, Vf2 is carried out by injecting hot electrons when current is made to flow respectively to the transistor 245, 246.

Further, the memory cell array which can be subjected to defect redundancy by the present invention is not limited to SRAM but is applicable to a redundancy circuit of an array of DRAM.

Figure 18:
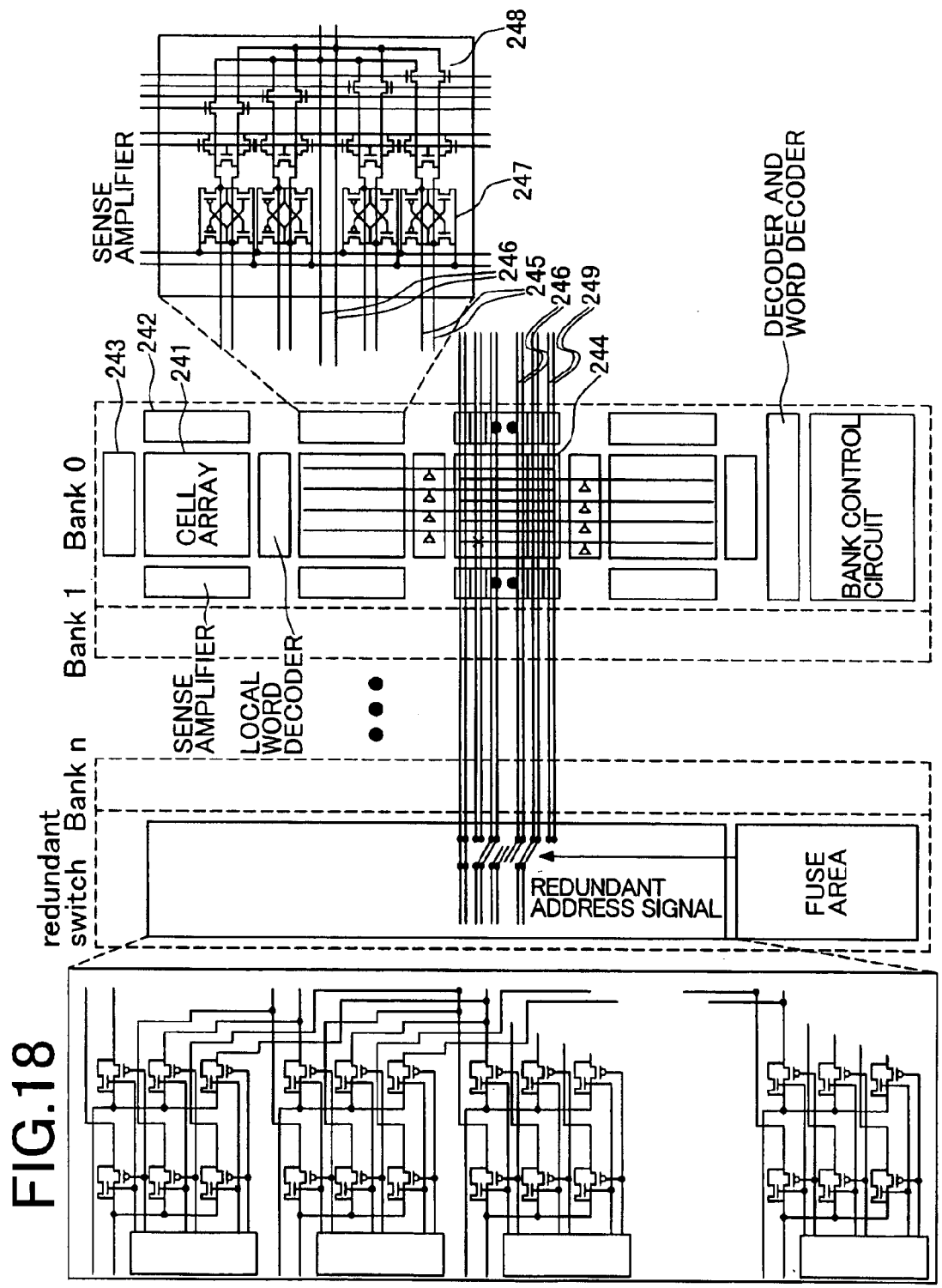
FIG. 18 is a diagram showing an example of applying the present invention to a redundancy circuit of an array of DRAM.

In FIG. 18, numeral 241 designates a memory cell array which is constituted by aligning memory cells each having 1 transistor and 1 capacitor in an array. Numeral 242 designates a sense amplifier area and 243 designates a local word decoder. Banks are constituted by arranging pluralities of the portions 241, 242 and 243. The banks are constituted of (n+1) pieces of Bank0 through Bankn and on the left side of Bank n, there is provided an area of a redundant switch.

Meanwhile, redundant columns 244 are provided on lower sides of the respective memory cell array. A signal outputted from the memory cell is outputted to a bit line 245 and is amplified by a sense amplifier 247. Amplified data is selected by a selector 248 and is outputted to a global bit line 246. The global bit line is arranged to span the respective banks and finally, data is outputted therefrom to the redundant switch. The situation stays the same with regard to the global bit line for redundancy.

When a defect is present in the memory cell array as shown by, for example, X mark, the defect can be salvaged by switching the global bit line by a signal from a fuse by the flash memory. The situation is similar to that in the embodiment of SRAM of FIG. 1 and the feature of capable of carrying out salvation and test inexpensively by finishing also the salvation during the testing operation, is similar to that in the above-described embodiments.

Further, the present invention is applicable not only to defect redundancy of the memory cell array but also to trimming operation. The example is shown in FIG. 19 and FIG. 20.

Figure 19:
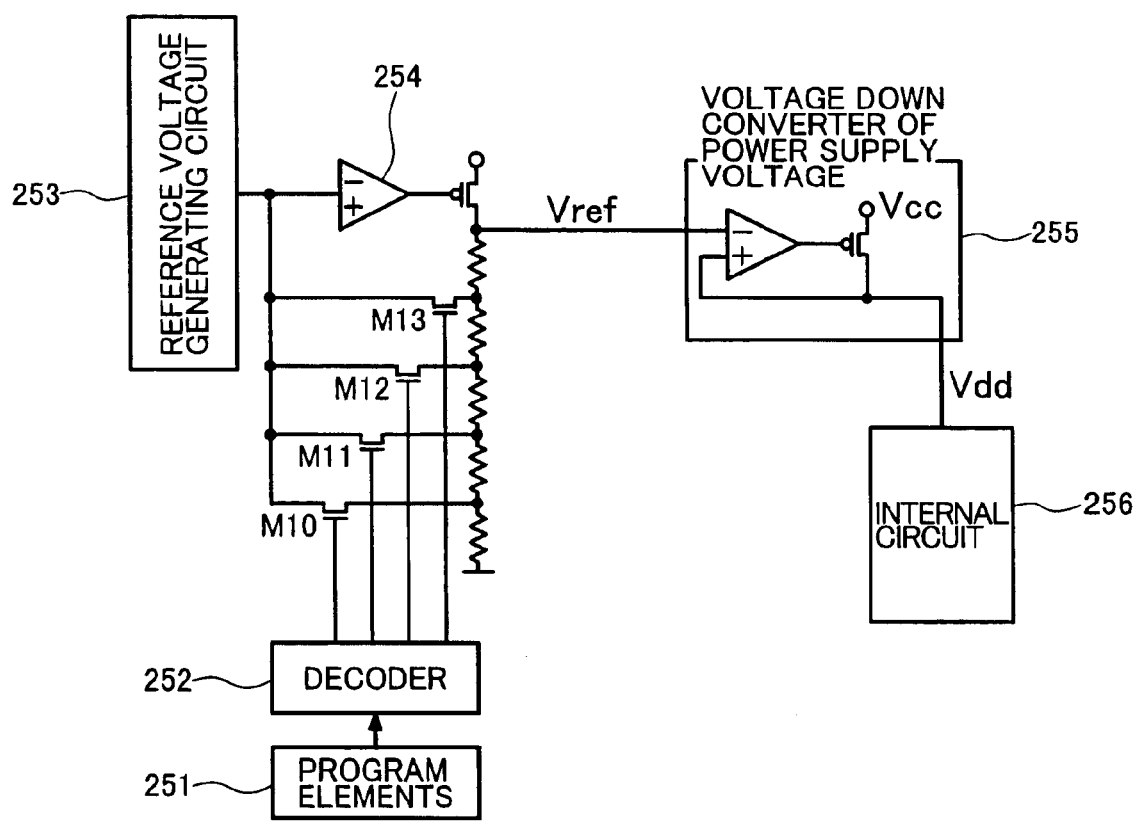
FIG. 19 is a diagram showing an embodiment of applying the present invention to a voltage down converter of power supply voltage of an integrated circuit.

FIG. 19 shows an example of applying the program elements by the flash memory to a voltage down converter of power supply voltage of an integrated circuit. According to the embodiment, power supply voltage Vcc applied from outside is applied by forming power supply voltage Vdd suitable for an internal circuit 256 of LSI via a voltage down converter of power supply voltage 255. The voltage down converter of power supply voltage 255 generates power supply voltage Vdd by using reference voltage Vref. Although in this case, the reference voltage is made by a circuit of band gap reference, there is a case in which by a fluctuation in process, a value thereof is changed. In this case, by using the program elements 251 by the flash memory, programming is executed and by making ON any of transistors M10, M11, M12 and M13, the reference voltage can be corrected.

Figure 20:
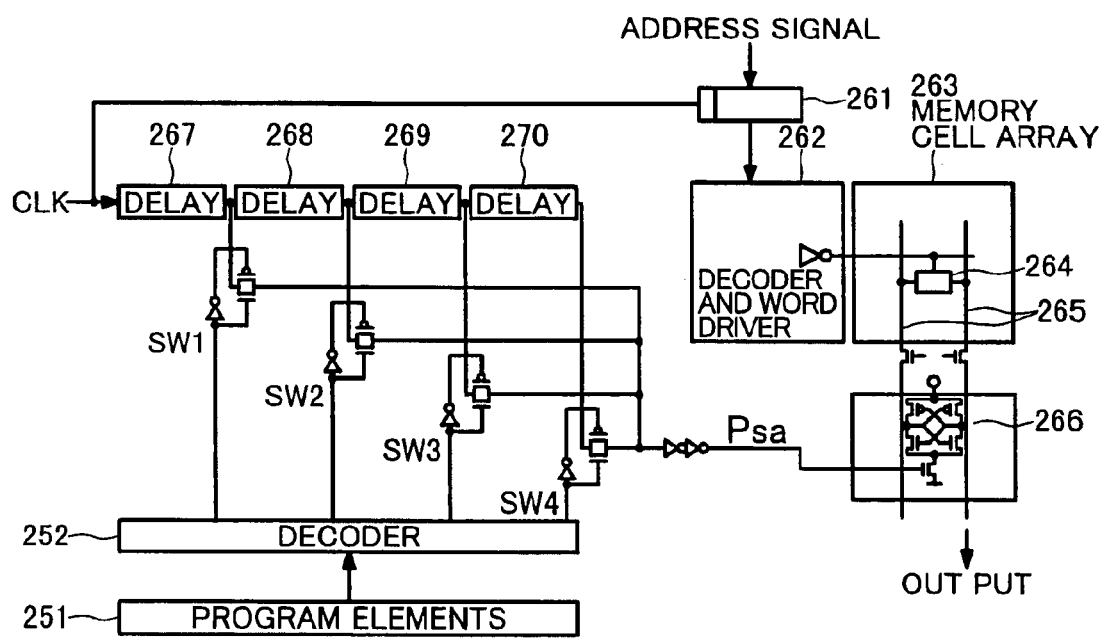
FIG. 20 is a diagram showing an embodiment of applying the present invention to delay adjustment of a delay circuit.

FIG. 20 shows an example of applying the program elements by the flash memory to delay adjustment of a delay circuit. The embodiment is an example in which the delay circuit is used particularly in adjusting timings of activating a sense amplifier in SRAM.

According to the embodiment, an address signal is inputted to a latch circuit 16 by a clock signal CLK. The inputted address signal is decoded by a decoder and word driver 262 to thereby activate a word line. A data signal is outputted to a bit line from a selected memory cell 264 in a memory cell array 263. By amplifying the signal by a sense amplifier 266, data is provided. The sense amplifier 266 is activated by a signal Psa. In this case, when activating time of the signal Psa is excessively early relative to the clock signal, the bit line signal is not provided and reading is failed. Further, when the activating time of the signal Psa is excessively delayed, reading time is delayed. The timing of the activating signal Psa is adjusted to an optimum value by using the program elements 251 using the flash memory. That is, there is selected an optimum switch in switches SW1 through SW4 by using the program elements. Thereby, the number used in delay elements 267 through 270 is selected and the timing of applying the activating signal Psa can be made an optimum value.

When the program elements by the flash memory are used, the trimming operation of the reference voltage and the timing can electrically be carried out in testing and accordingly, the operation can be executed inexpensively. The data can be stored to the program elements shown by FIG. 1B along with the defect redundancy information and can be read and written similar to the defect redundancy information.

Figure 22:
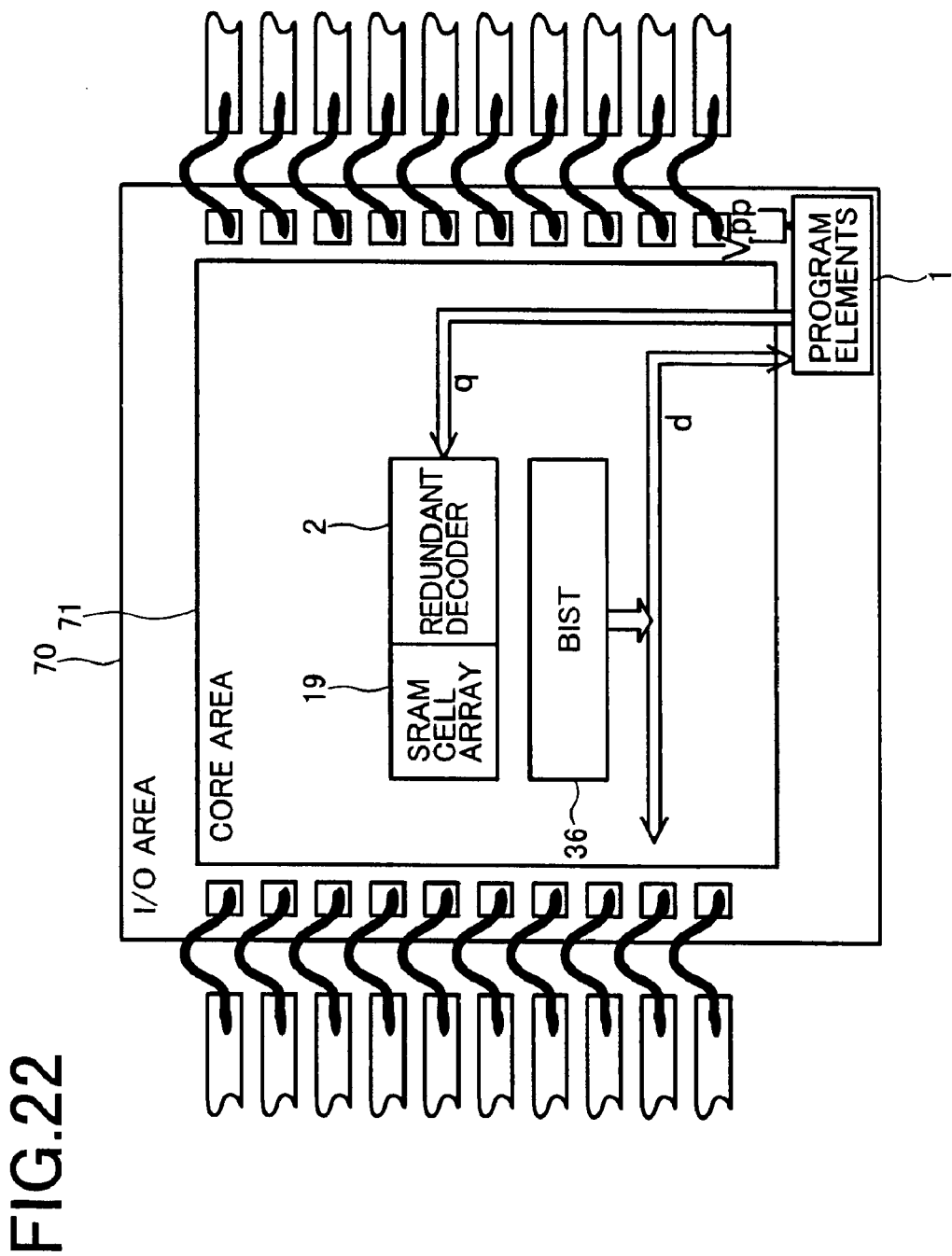
FIG. 22 shows an embodiment in which Vpp pins are not connected to a lead frame of a package.
Figure 23:
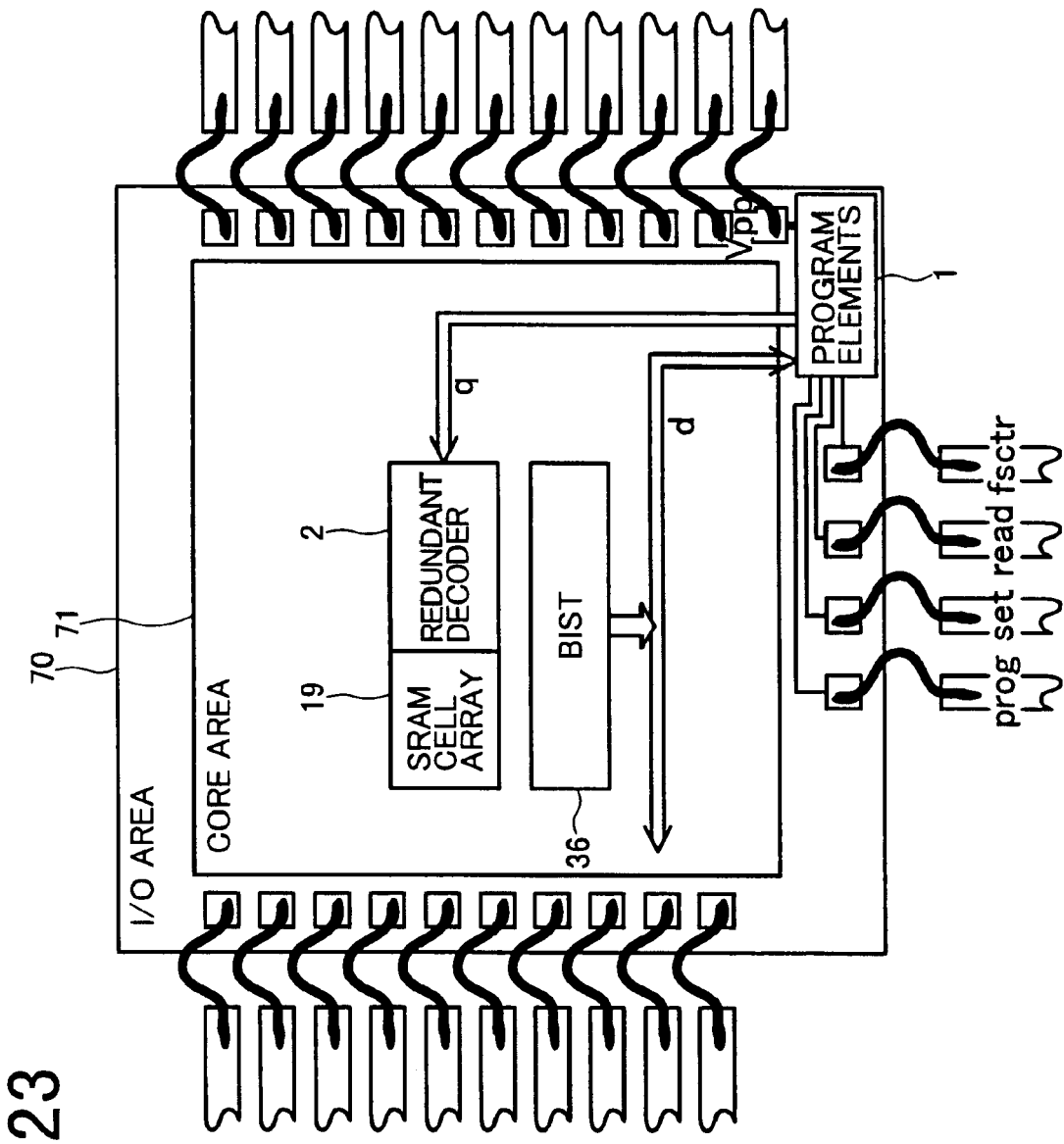
FIG. 23 shows an embodiment in which Vpp pins are connected to a lead frame of a package.

FIG. 22 and FIG. 23 show an embodiment in which the semiconductor integrated circuit according to the present invention is connected to a lead frame (external terminal) of a package. In the example of FIG. 22, in integrating LSI, the lead frame is not connected with pads for high voltage provided from outside for writing data to the flash memory. In this case, writing of data to the flash memory is carried out by using a tester in a wafer stage. Vpp pins are not connected to the lead frame and accordingly, after integration, data cannot be written to the flash memory and it can be prevented that erroneous data is unpreparedly written to the flash memory by the user of LSI.

According to the embodiment of FIG. 23, the Vpp pins are connected to the lead frame and accordingly, in addition to the fact that data can be written to the flash memory by using the tester in the wafer stage, even after integration, testing can be carried out and data can be written to the flash memory. Further, in this case, it is naturally necessary that pads for inputting control signals necessary for writing data to the flash memory are connected to the lead frame. Such two stages of redundancy method is shown in FIG. 24.

As shown by the drawing, first, the memory is tested in the wafer stage and based on the result, data is written to the flash memory to thereby carry out redundancy. Thereafter, after assembly, there is carried out burn-in which is an acceleration test under high temperature and high voltage. After the burn-in, the memory is inspected again and when there is a new defect, data can be written to the flash memory by applying high voltage to the Vpp pin. According to the embodiment, a defect caused in the burn-in can be salvaged and therefore, there is achieved an effect of further promoting the yield of the memory.

Further, although an explanation has been given of the defect redundancy of the memory cell array in testing, the same goes with the trimming.

According to the invention, there is used an erasable and writable flash memory and therefore, when a deterioration seems to cause in storing and holding data to the flash memory including after the burn-in, the data can be erased and rewritten by carrying out the testing again. Thereby, there is achieved an effect of further promoting the yield.

As has been described in the embodiments, according to the present invention, there is used the nonvolatile memory element with a first layer of polysilicon which can be fabricated by the process of forming a CMOS devise as constituting the floating electrode and an address or trimming information for salvaging a defect of the memory cell array in the semiconductor is stored. Thereby, defect redundancy and trimming can be realized inexpensively even in the semiconductor integrated circuit such as system LSI.

Further, the nonvolatile memory element is programmed in testing the semiconductor integrated circuit. Thereby, apparatus of laser beam or the like for programming is not needed, a time period necessary for the programming can be shortened and accordingly, the testing cost can be reduced.

What is claimed is:

1. A semiconductor integrated circuit device comprising:
a nonvolatile memory to store redundant address information or trimming information;
a decoder to decode the redundant address information or the trimming information stored in the nonvolatile memory; and
a switch circuit controlled by the decoder,
wherein the nonvolatile memory includes nonvolatile memory cells each having a first semiconductor area of a first conductivity type formed in a main surface of a semiconductor substrate, and a second semiconductor area of a second conductivity type formed in the main surface of the semiconductor substrate, a source area and a drain area of the second conductivity type formed in the first semiconductor area and a gate electrode formed by interposing an insulating film between the first semiconductor area and the second semiconductor area and a floating gate, and being capable of writing and reading by applying a predetermined voltage to the second semiconductor area and to at least one of the source area and the drain area;
wherein the nonvolatile memory cell is applied with the predetermined voltage to read in accordance with a reset signal, and the redundant address information or the trimming information read from the nonvolatile memory is stored in a register, and wherein, while the semiconductor integrated circuit device is powered after storing the redundant address information or the trimming information in the register, the redundant address information or the trimming information read from the nonvolatile memory is held in the register and the nonvolatile memory cell is not applied with the predetermined voltage.

2. The semiconductor integrated circuit device according to claim 1:

wherein the reset signal is generated when the semiconductor integrated circuit device is powered.

3. The semiconductor integrated circuit device according to claim 1:

wherein a logic circuit, the register and a state machine included in the semiconductor integrated circuit are initialized in accordance with the reset signal.

4. The semiconductor integrated circuit device according to claim 1:

wherein data-read from the nonvolatile memory is stored in a static register.

5. The semiconductor integrated circuit device according to claim 1, further comprising:

a logic circuit;

a first pad to input a voltage higher than an operation voltage of the logic circuit for a writing operation of the nonvolatile memory; and a second pad to input or output a signal to or from the logic circuit, wherein the second pad is connected to an external terminal and the first pad is not connected to an external terminal.

* * * * *